(12) United States Patent
Pan et al.

(10) Patent No.: US 10,453,766 B2
(45) Date of Patent: Oct. 22, 2019

(54) INTEGRATED PACKAGING DEVICES AND METHODS WITH BACKSIDE INTERCONNECTIONS

(71) Applicant: OBSIDIAN SENSORS, INC., La Jolla, CA (US)

(72) Inventors: Yaoling Pan, San Diego, CA (US); Tallis Young Chang, San Diego, CA (US); John Hyunchul Hong, San Clemente, CA (US)

(73) Assignee: OBSIDIAN SENSORS, INC., San Diego, CA (US)

( * ) Notice: Subject to any disclaimer, the term of this patent is extended or adjusted under 35 U.S.C. 154(b) by 0 days.

(21) Appl. No.: 15/351,180

(22) Filed: Nov. 14, 2016

(65) Prior Publication Data

US 2018/0138102 A1    May 17, 2018

(51) Int. Cl.
*H01L 51/56* (2006.01)
*H01L 23/31* (2006.01)
(Continued)

(52) U.S. Cl.
CPC ........ *H01L 23/3121* (2013.01); *B81B 7/0058* (2013.01); *B81C 1/00238* (2013.01); *B81C 1/00301* (2013.01); *H01L 21/568* (2013.01); *H01L 21/6835* (2013.01); *H01L 21/76898* (2013.01); *H01L 23/3135* (2013.01); *H01L 23/528* (2013.01); *H01L 23/5226* (2013.01); *H01L 27/124* (2013.01); *H01L 33/52* (2013.01);
(Continued)

(58) Field of Classification Search
None
See application file for complete search history.

(56) References Cited

U.S. PATENT DOCUMENTS 6,929,974 B2    8/2005    Ding et al.
7,675,162 B2    3/2010    Foster et al.
(Continued)

FOREIGN PATENT DOCUMENTS

WO    2015/082953    6/2015

OTHER PUBLICATIONS

International Search Report and Written Opinion for PCT/US2017/061354, dated May 18, 2018, 19 pages.
(Continued)

*Primary Examiner* — Fernando L Toledo
*Assistant Examiner* — Valerie N Newton
(74) *Attorney, Agent, or Firm* — Morrison & Foerster LLP

(57) ABSTRACT

This disclosure provides devices and methods for 3-D device packaging with backside interconnections. One or more device elements can be hermetically sealed from an ambient environment, such as by vacuum lamination and bonding. One or more via connections provide electrical interconnection from a device element to a back side of a device substrate, and provide electrical interconnection from the device substrate to external circuitry on the back side of the device. The external circuitry can include a printed circuit board or flex circuit. In some implementations, an electrically conductive pad is provided on the back side, which is electrically connected to at least one of the via connections. In some implementations, the one or more via connections are electrically connected to one or more electrical components or interconnections, such as a TFT or a routing line.

31 Claims, 16 Drawing Sheets

(51) Int. Cl.
*B81B 7/00* (2006.01)
*B81C 1/00* (2006.01)
*H01L 21/56* (2006.01)
*H01L 21/683* (2006.01)
*H01L 21/768* (2006.01)
*H01L 23/522* (2006.01)
*H01L 23/528* (2006.01)
*H01L 27/12* (2006.01)
*H01L 33/52* (2010.01)
*H01L 33/62* (2010.01)
*H01L 51/00* (2006.01)
*H01L 51/52* (2006.01)

(52) U.S. Cl.
CPC ............ *H01L 33/62* (2013.01); *H01L 51/003* (2013.01); *H01L 51/5203* (2013.01); *H01L 51/5253* (2013.01); *H01L 51/56* (2013.01); *B81C 2203/0145* (2013.01); *B81C 2203/0785* (2013.01); *B81C 2203/0792* (2013.01); *H01L 2933/005* (2013.01); *H01L 2933/0066* (2013.01)

(56) References Cited

U.S. PATENT DOCUMENTS

| | | | |
|---|---|---|---|
| 8,809,972 B2 * | 8/2014 | Huang | B81B 7/0064 |
| | | | 257/415 |
| 9,156,678 B2 | 10/2015 | Li et al. | |
| 2004/0026361 A1 | 2/2004 | Namba et al. | |
| 2007/0099395 A1 | 5/2007 | Sridhar et al. | |
| 2010/0244161 A1 * | 9/2010 | Tabrizi | H01L 23/055 |
| | | | 257/415 |
| 2013/0119492 A1 | 5/2013 | Feiertag et al. | |
| 2015/0115376 A1 | 4/2015 | Chen et al. | |

OTHER PUBLICATIONS

International Preliminary Report on Patentability for PCT/US2017/061354, dated May 14, 2019, 11 pages.

* cited by examiner

US 10,453,766 B2

INTEGRATED PACKAGING DEVICES AND METHODS WITH BACKSIDE INTERCONNECTIONS

TECHNICAL FIELD

This disclosure relates to three-dimensional (3-D) device packaging, and more particularly to backside electrically conductive interconnects for 3-D device packages.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography and other micromachining processes that etch away parts of substrates or deposited material layers, or that add layers to form electrical and electromechanical devices.

Device packaging can protect the functional components of devices, including EMS and MEMS-based device elements, from the environment. One type of EMS or MEMS-based device element is an interferometric modulator (IMOD). A seal around the EMS and MEMS-based device elements can enclose the device and protect the device from moisture and environmental contaminants as well as provide mechanical support for system components. In addition, device packaging can integrate different functional components in a manufacturing process and realize system in packaging (SiP).

SUMMARY

The systems, methods and devices of this disclosure each have several innovative aspects, no single one of which is solely responsible for the desirable attributes disclosed herein.

One innovative aspect of the subject matter described in this disclosure can be implemented in a device having a front side and a back side opposite the front side. The device includes a device substrate, a device element over the device substrate and on the front side of the device where the device element is hermetically sealed, an electrically conductive pad exposed on the back side of the device and one or more via connections extending at least partially through the device substrate. At least one of the via connections is electrically connected to the electrically conductive pad, and the one or more via connections provide electrical interconnection from the device element to the electrically conductive pad.

In some implementations, the one or more via connections are electrically connected to one or both of a routing line and a thin film transistor (TFT) in the device substrate. In some implementations, the device has a device area and a peripheral area outside of the device area, where the device element and the electrically conductive pad are in the device area. In some implementations, the device has a device area and a peripheral area outside of the device area, where the device element is in the device area and the electrically conductive pad and the one or more via connections are in the peripheral area. In some implementations, the electrically conductive pad is connected to a flex circuit or a printed circuit board (PCB) on the back side of the device. The device has a pad pitch compatible with a pad pitch of the PCB. In some implementations, the device further includes a laminated sealing structure to hermetically seal the device element. The device element includes a protective layer with a release hole extending through the protective layer to a cavity inside the device element, where the laminated sealing structure includes a bonding component covering the release hole, an adhesive layer on the bonding component and a barrier layer on the adhesive layer. In some implementations, the device element further includes a seal ring on the protective layer, where the bonding component forms either a metal-to-metal bond with the seal ring or a dielectric-to-dielectric bond with the protective layer. In some implementations, the device further includes a passive component on the back side of the device, where the passive component includes a resistor, capacitor or an inductor.

Another innovative aspect of the subject matter described in this disclosure can be implemented in a device. The device includes a substrate and a plurality of device elements positioned over the substrate. Each of the device elements include a functional unit and a protective layer over the functional unit, where the protective layer has a release hole extending through the protective layer to access a cavity inside the device element. The device further includes a laminated sealing structure bonded over the plurality of device elements to hermetically seal the device, where the laminated sealing structure includes an adhesive layer and one or more bonding components on a side of the adhesive layer facing the plurality of device elements, each of the bonding components sealing each of the release holes of the protective layer.

In some implementations, the laminated sealing structure further includes a barrier layer on a side of the adhesive layer opposite the side facing the plurality of device elements. In some implementations, the protective layer includes a bonding structure, where each of the bonding components form a metal-to-metal bond with the bonding structure or a dielectric-to-dielectric bond with the bonding structure, where the metal-to-metal bond includes a metallic bond with the bonding structure and the dielectric-to-dielectric bond includes a covalent bond with the bonding structure. In some implementations, a pressure inside the cavity is controlled to be less than a pressure outside the cavity.

Another innovative aspect of the subject matter described in this disclosure can be implemented in a method of manufacturing a device having a front side and a back side opposite the front side. The method includes providing a carrier substrate, forming a release layer on the carrier substrate, forming an electrically conductive pad over the release layer, forming a device substrate over the release layer and the electrically conductive pad, forming a via connection at least partially through the device substrate on a front side of the device to connect to the electrically conductive pad on a back side of the device, forming a device element over the device substrate on the front side where the device element is electrically connected to the electrically conductive pad through the via connection and forming a sealing structure to hermetically seal the device element from the ambient environment.

In some implementations, forming the sealing structure includes forming a release hole extending into the device element, and laminating the sealing structure over the device element and the release hole where the sealing structure includes a bonding component covering the release hole and an adhesive layer on the bonding component. In some implementations, laminating the sealing structure includes reducing a pressure inside a cavity of the device element to less than 50 Torr, contacting the sealing structure with the device element and increasing a pressure outside the cavity to greater than 50 Torr. In some implementations, the method further includes removing the release layer to detach the carrier substrate from the device and expose the electrically conductive pad at the back side of the device. In some implementations, the method further includes connecting external circuitry to the device by connecting the external circuitry to the exposed electrically conductive pad, where the external circuitry includes a flex circuit or a PCB.

Another innovative aspect of the subject matter described in this disclosure can be implemented in a method of manufacturing a device having a front side and a back side opposite the front side. The method includes providing a carrier substrate, forming a release layer on the carrier substrate, forming a device substrate over the release layer where the device substrate includes one or more electrical components or interconnects, forming a first via connection at least partially through the device substrate on the front side of the device, forming a device element over the device substrate on the front side of the device where the device element is electrically connected to the one or more electrical components or interconnects through the first via connection, forming a second via connection at least partially through the device substrate on the back side of the device to connect to the one or more electrical components or interconnects, forming an electrically conductive pad connected to the second via connection at the back side of the device and forming a sealing structure to hermetically seal the device element.

In some implementations, the method further includes forming a release hole extending into the device element and laminating the sealing structure over the device element and the release hole where the sealing structure includes a bonding component covering the release hole and an adhesive layer on the bonding component. In some implementations, the method further includes connecting external circuitry to the device by connecting the external circuitry to the electrically conductive pad, where the external circuitry includes a flex circuit or a PCB. In some implementations, the method further includes removing the release layer to detach the carrier substrate from the device and expose the device substrate at the back side of the device.

Details of one or more implementations of the subject matter described in this disclosure are set forth in the accompanying drawings and the description below. Although the examples provided in this disclosure are primarily described in terms of EMS and MEMS-based device elements, the concepts provided herein may apply to other types of device elements such as liquid crystal display (LCDs) elements, organic light-emitting diode ("OLED") elements and field emission display elements, and micro-LED displays. Other features, aspects and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1A:
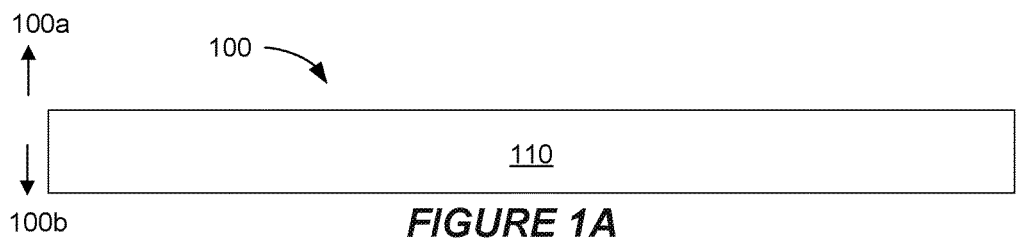
FIGS. 1A-1K shows cross-sectional schematic illustrations of various stages in a process of manufacturing an example device with backside interconnections.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate 3-D to device packaging and backside interconnections. The demand for a reduction in size and an increase in the complexity of electronic components has driven the semiconductor industry to produce smaller and more complex integrated circuits (ICs). For many applications such as an increasing number of portable electronic components (smartphones, smartwatches, etc.), various 3-D packaging technologies have been implemented to reduce cost, reduce form factor and reduce profile. Wafer-level packaging allows for packaging of devices and ICs on the wafer itself rather than dicing the wafer into several individual ICs and then packaging them. Chip scale packaging allows for packaging so that the total packaging area is not much larger than the size of the IC chip itself. Wafer-level chip scale packaging (WL-CSP) allows for IC chips to be directly mounted to, for example, a printed circuit board (PCB). Such packaging schemes reduce overall manufacturing costs, provide thinner form factor, provide a lower profile and improve device performance.

IC chips may include device elements of a device. Some IC chips may include display elements of displays such as OLEDs, IMODs, LCDs, LEDs, bi-stable displays or analog displays. Some IC chips can include thin film switching devices such as thin film transistors (TFTs) or thin film diodes. Thin film switching devices can electrically communicate with the display elements.

Many conventional types of packaging, including wire-bonding packaging, flip-chip packaging and wafer-level chip scale packaging provide circuit routing capabilities over the IC chip itself. Electrically conductive pads, routing lines, solder bumps and other electrical components are formed on a front side (or front surface) of a wafer so that electrical interconnections to the IC chip can be made. However, this may limit device integration and result in bulkier and larger packaging. In addition, many conventional packaging technologies result in devices with a wide border that can limit useful display area and lead to larger form factors. Packaging solutions in many EMS and MEMS technologies are often discrete from the rest of the device or system that results in bulkier and larger packaging. Especially in EMS and MEMS packaging, it is desirable to not only integrate device components with circuitry while minimizing package size, but to also sufficiently protect the device components.

Many electronic devices, including OLEDs and MEMS, LED devices, are packaged to withstand environmental forces and protect against the ingress of moisture and other environmental agents (such as oxygen). For example, moisture can lead to stiction and device failure in EMS or MEMS devices, and oxygen can degrade OLEDs over time and reduce device performance. Thus, various electronic devices require effective seals to protect the devices from ambient forces and conditions. Device seals using epoxy-based adhesives may be less expensive and less complicated than other sealing technologies, but do not provide a hermetic seal. Moreover, epoxy-based adhesives may lack sufficient mechanical strength, may be too high in outgassing and may be too permeable to moisture ingress. Device seals using metallic soldering or a glass frit may provide a hermetic seal, but the process is more complicated, may result in a low yield and the material of the solder or frit may not be compatible with the device. Device seals using thin film encapsulation (TFE) may provide a hermetic seal, but the process (such as physical vapor deposition, chemical vapor deposition, etc.) may be costly.

Rather than provide via connections and routing to a front side (or front surface) of a device, the present disclosure provides for via connections and routing to a back side (or back surface) of a device. Via connections can be provided without etching through a substrate to form through-silicon vias or through-glass vias. Conductive pads can be routed to preferred areas on the back side of the device so that they are compatible with external circuitry. In addition, the present disclosure provides for a hermetic seal to protect device components from environmental forces. The hermetic seal can include a laminated structure using solder or dielectric material without a soldering process.

Particular implementations of the subject matter described in this disclosure can be implemented to realize one or more of the following potential advantages. Hermetically sealing the device can be performed on a wafer or panel level to reduce overall manufacturing costs. This allows for devices to be packaged on the wafer or panel itself rather than dicing the wafer or panel into several discrete devices and then packaging them. The hermetic seal provides for protection against moisture ingress and other environmental forces to improve device reliability and lifetime. Additionally, hermetically sealing the device can provide mechanical strength to the device and enable backside processing. With backside processing, electrical interconnections can be made on a back side of a device rather than a front side. Electrical interconnection can be made from a device element to a pad on the back side using one or more via connections. Such backside processing minimizes circuitry and hardware on the edges to enable a narrower border, or bezel, which allows for a larger active area in the device. In addition, such backside processing can integrate different functional components in a device package, and can be performed on a wafer or panel level without through-silicon vias (TSVs) or through-glass vias (TGVs). This can simplify the manufacturing processes, reduce manufacturing costs, provide greater device integration, and enable system-in-packaging (SiP) operations. Furthermore, such backside processing eliminates a thick substrate on the back side to reduce form factor and provide a thinner profile. Backside processing also can enable routing of pads on the back side to provide a pad pitch compatible with a pad pitch of external circuitry (such as PCBs).

FIGS. 1A-1K shows cross-sectional schematic illustrations of various stages in a process of manufacturing an example device with backside interconnections. The process of manufacturing the device may be performed in a different order or with different, fewer or additional operations. A device 100 includes a front side 100a and a back side 100b opposite the front side 100a. The front side 100a includes device elements 150, such as OLED, MEMS or LED device elements, disposed on a device substrate 140.

FIG. 1A shows a cross-sectional schematic of the partially fabricated device 100, where a substrate 110 is provided. The substrate 110 can be made of any suitable substrate materials, including substantially transparent materials and non-transparent materials. The substrate 110 can include a non-transparent or semi-transparent material, which can be utilized in top emission OLED or LED displays and reverse IMOD displays. The substrate 110 can include a transparent or substantially transparent material, which can be utilized in bottom emission OLED or LED displays and IMOD displays. Examples of transparent or substantially transparent materials can include glass and plastic. Substantial transparency as used herein can be defined as transmittance of visible light of about 70% or more, such as about 80% or more or about 90% or more. Glass substrates (sometimes referred to as glass plates or panels) may be or include a borosilicate glass, a soda lime glass, photoglass, quartz, Pyrex or other suitable glass material. A non-glass substrate can be used, such as a polycarbonate, acrylic, polyimide, polyethylene terephthalate (PET) or polyether ether ketone (PEEK) substrate. In some implementations, the substrate 110 can be non-transparent or semi-transparent and made of silicon, metal, ceramic, alloy, aluminum foil or other suitable material. In some implementations, the substrate 110 can have a thickness of a few microns to hundreds of microns. The substrate 110 can typically have a thickness greater than about 10 µm. The substrate 110 can be a carrier substrate because the carrier substrate is configured to be subsequently detached or removed from the device 100.

Figure 1B:
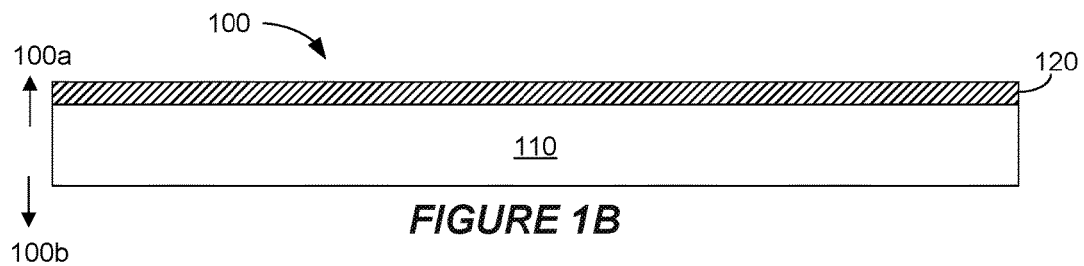

FIG. 1B shows a cross-sectional schematic of the partially fabricated device 100 up to this point, where a release layer 120 is provided over the carrier substrate 110. The release layer 120 can include a material that is capable of being removed, such as by a thermal, chemical or laser removal process, so that the carrier substrate 110 can be subsequently detached from the rest of the device 100. The release layer 120 may be formed on the carrier substrate 110 by a conventional deposition process, such as a chemical vapor deposition (CVD), plasma-enhanced chemical vapor deposition (PECVD), physical vapor deposition (PVD) process, solution-based coating processes or evaporation process, for example. In some implementations, the release layer 120 includes a suitable sacrificial material, such as molybdenum, amorphous silicon, polycrystalline silicon, germanium, germanium oxide, silicon oxide including silicon dioxide, polymers and combinations thereof. In some implementations, the release layer 120 has a thickness between about 0.01 µm and about 1 µm, or between about 0.1 µm and about 0.5 µm.

Figure 1C:
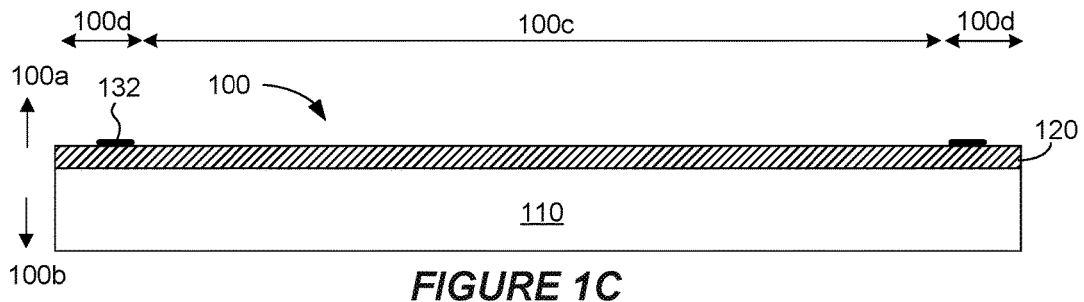

FIG. 1C shows a cross-sectional schematic of the partially fabricated device 100 up to this point, where one or more electrically conductive pads 132 are formed on the release layer 120. In some implementations, a buffer layer (not shown) is formed between the electrically conductive pads 132 and the release layer 120 to provide additional mechanical strength to the device 100. The device 100 can include a device area 100c and a peripheral area 100d outside of the device area 100c. The peripheral area 100d can surround the device area 100c. For example, in a display device, the device area 100c can include an active display area and the peripheral area 100d can include a non-display area. The electrically conductive pads 132 include an electrically conductive material, such as a metal, and can provide electrical interconnection to other electronic components of the device 100. The electrically conductive pads 132 may be deposited using any suitable deposition technique and patterned to be in the peripheral area 100d of the device 100.

Figure 1D:
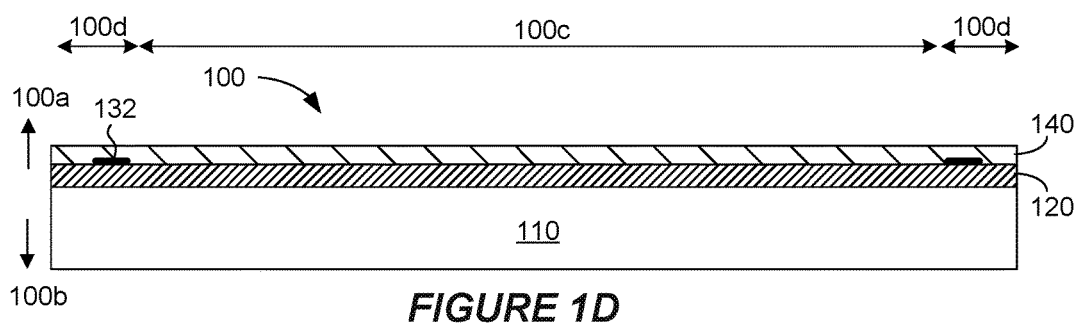

FIG. 1D shows a cross-sectional schematic of the partially fabricated device 100 up to this point, where a device substrate 140 is formed over the electrically conductive pads 132 and the release layer 120. The device substrate 140 can be an active substrate or a passive substrate. As an active substrate, the device substrate 140 can include active components such as transistors, metal layers and routing. For example, the device substrate 140 can include one or both of a TFT and routing lines. As a passive substrate, the device substrate 140 can include passive components such as resistors, capacitors and inductors. The device substrate 140 is thinner than the carrier substrate 110. In some implementations, the device substrate 140 is substantially thinner than the carrier substrate 110, such as at least 3 times, 5 times, 10 times, 20 times or 50 times thinner than the carrier substrate 110. In some implementations, the device substrate 140 has a thickness between about 0.5 µm and about 10 µm, or between about 1 µm and about 10 µm. In some implementations, the device substrate 140 includes any suitable substrate material, such as glass, plastic, silicon, metal, ceramic, alloy or any other suitable substrate material.

Figure 1E:
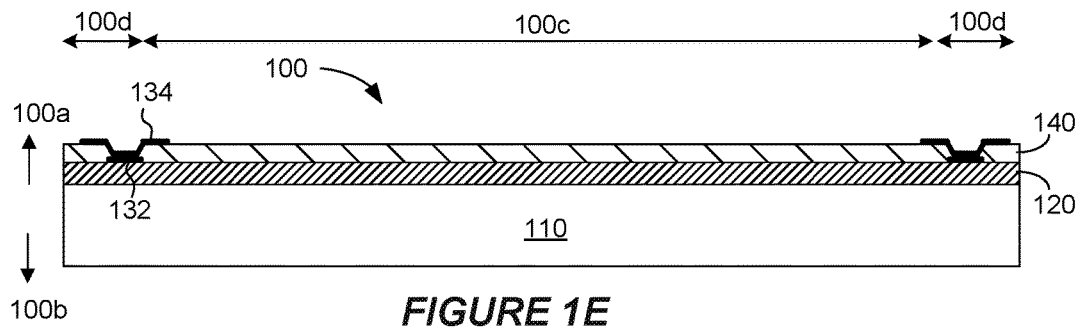

FIG. 1E shows a cross-sectional schematic of the partially fabricated device 100 up to this point, where one or more via connections 134 are formed at least partially through the device substrate 140 to connect to the one or more electrically conductive pads 132. At least a portion of the device substrate 140 is etched, drilled or otherwise removed in the peripheral area 100d of the device 100. The one or more electrically conductive pads 132 may be exposed. Electrically conductive material may be deposited and patterned in the peripheral area 100d to form the via connections 134 and provide electrical connection to the electrically conductive pads 132. The one or more via connections 134 may include an electrically conductive material, such as a metal, and may be deposited and patterned using any suitable technique. The one or more via connections 134 may provide electrical interconnection from the device area 100c to the peripheral area 100d.

Figure 1F:
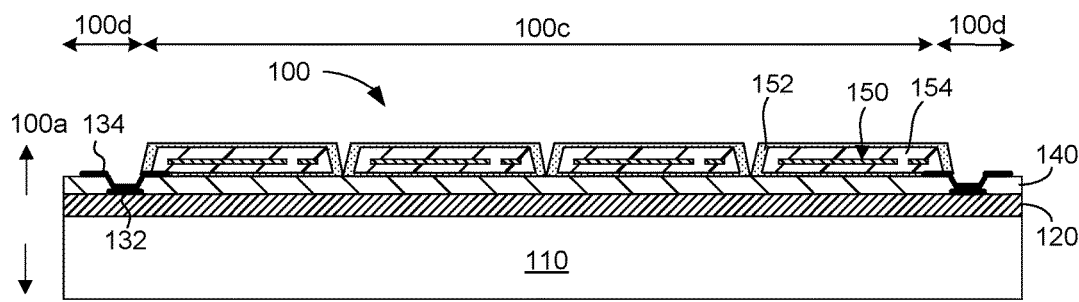

FIG. 1F shows a cross-sectional schematic of the partially fabricated device 100 up to this point, where one or more device elements 150 are formed over the device substrate 140 in the device area 100c. The device elements 150 are disposed in the front side 100a of the device 100. The placement or positioning of the device elements 150 can define the front side 100a as well as the device area 100c of the device 100. At least some of the device elements 150 may be electrically connected to the one or more electrically conductive pads 132 by the one or more via connections 134. Accordingly, communication with other circuitry and components may be made from the device elements 150 in the device area 100c to the peripheral area 100d. Moreover, as discussed below, communication with other circuitry and components may be made from the device elements 150 in the front side 100a to the back side 100b of the device 100.

In some implementations, the device elements 150 can include any active element configured to carry out one or more operations of the device 100. In some implementations, the device elements 150 include display elements such as OLED elements, LED elements, EMS display elements or MEMS display elements. In some implementations, the device elements 150 include EMS or MEMS elements that are not display elements. Examples of EMS or MEMS elements that are not display elements include but are not limited to touch sensors, pressure sensors, gas sensors, RF switches, accelerometers, gyroscopes, microphones and speakers. The device elements 150 are configured to be sealed in the device area 100c. In some implementations, the device elements 150 are configured to be sealed within a controlled environment and pressure. As shown in FIG. 1F, each of the device elements 150 can include a protective layer 152 and a sacrificial layer 154 within the protective layer 152. The sacrificial layer 154 can include any suitable sacrificial material. Examples of sacrificial materials include but are not limited to molybdenum, amorphous silicon, polycrystalline silicon, germanium, germanium oxide, silicon oxide including silicon dioxide, polymers and combinations thereof. Suitable polymers may include polymethylmethacrylate (PMMA), polyimide, and photoresists. The protective layer 152 can include, for example, a dielectric material to protect functional units of the device element 150. In some implementations, such functional units can include OLED or LED display layers or movable layers of an EMS or MEMS element.

Figure 1G:
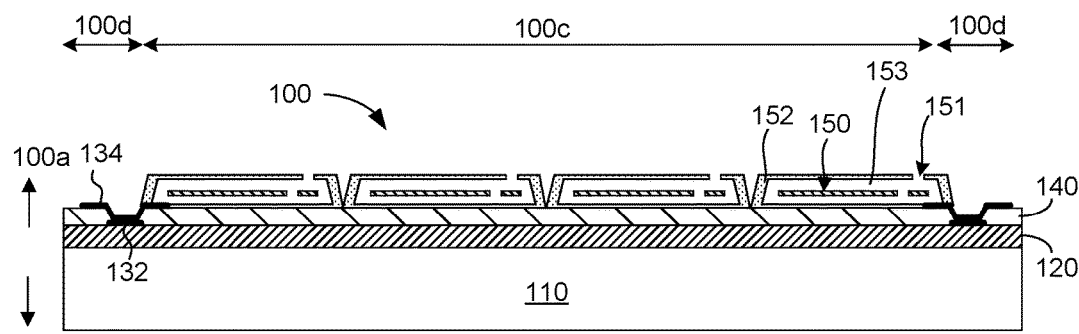

FIG. 1G shows a cross-sectional schematic of the partially fabricated device 100 up to this point, where a release hole 151 is formed through the protective layer 152 and the sacrificial layer 154 is removed to form a cavity 153 to access each of the device elements 150. In some implementations, the release hole 151 provides passage for etchants to pass through and allow the sacrificial layer 154 to be etched. Removal of the sacrificial layer 154 results in the formation of a gap or cavity 153 so that functional units of the device element 150 may be subject to a controlled pressure or environment. In some implementations, after the sacrificial layer 154 is removed, a pressure in at least some of the device elements 150 can be controlled to a pressure of less than about 760 Torr or less than about 50 Torr. In some implementations where the functional units are movable layers of an EMS or MEMS element, the movable layers may move within the cavity 153. In some implementations, a cavity 153 defining an evacuated gap is not present. For example, in the encapsulation of OLED elements, a sacrificial layer 154 for defining the cavity 153 is not needed.

Figure 1H:
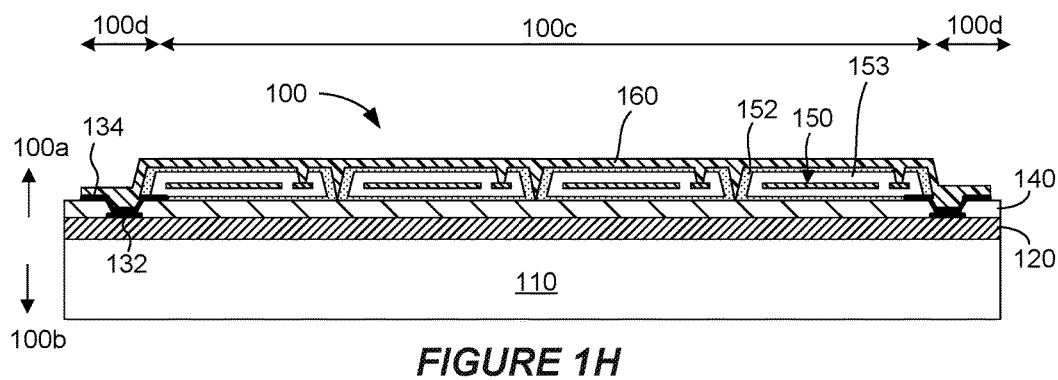

FIG. 1H shows a cross-sectional schematic of the partially fabricated device 100 up to this point, where a sealing structure 160 is provided to hermetically seal the one or more device elements 150. As shown in FIG. 1H, the sealing structure 160 can be formed, positioned, placed or disposed over the one or more device elements 150. The sealing structure 160 can plug, seal or otherwise cover the release hole 151. In some implementations, the sealing structure 160 can cover the protective layer 152 in the front side 100a of the device 100. The sealing structure 160 hermetically seals the device elements 150 from the ambient environment and protects the device elements 150 from environmental forces, such as moisture ingress. In some implementations, hermetically sealing the device elements 150 includes laminating the sealing structure 160 over the device elements 150. A pressure in the cavity 153 can be controlled to be, for example, less than a pressure outside of each of the device elements 150. One example of a lamination process is described in further detail below in FIGS. 4A-4G. In some implementations, hermetically sealing the device elements 150 includes depositing a thin film encapsulation layer over the device elements 150. In some implementations, the sealing structure 160 covers the device elements 150 in the device area 100c and the one or more via connections 134 in the peripheral area 100d. Thus, the sealing structure 160 encloses the device elements 150 in the packaging process.

Figure 1I:
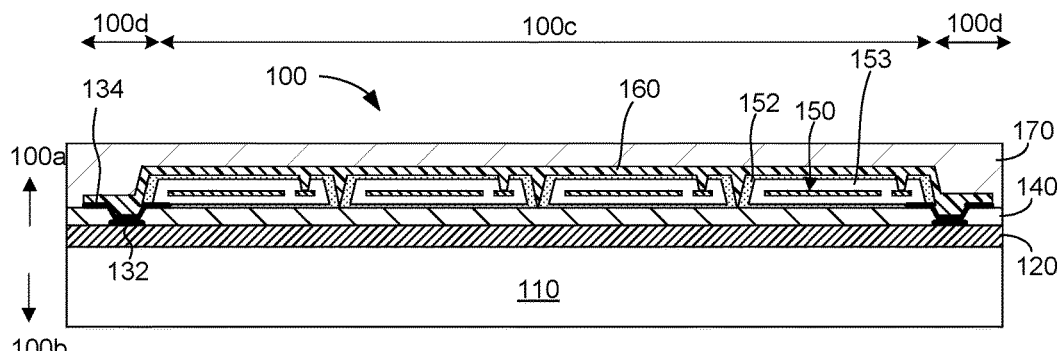

FIG. 1I shows a cross-sectional schematic of the partially fabricated device 100 up to this point, where a molding layer 170 is formed over the sealing structure 160. The molding layer 170 is optionally provided in the device 100 to provide mechanical rigidity to the device 100. In some implementations, the molding layer 170 includes a polymer material. In some implementations where the device elements 150 are display elements, such as top-emitting or top-reflective display elements where the light must transmit through the molding layer (such as OLED, LED, EMS or MEMS display elements), the molding layer 170 is substantially transparent to allow passage of light. In some implementations, the molding layer 170 has a thickness greater than about 10 µm, between about 10 µm and about 100 µm, or greater than about 100 µm.

Figure 1J:
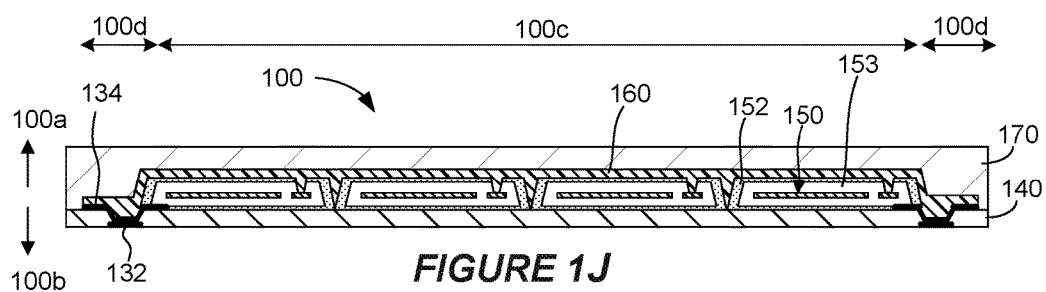

FIG. 1J shows a cross-sectional schematic of the partially fabricated device 100 up to this point, the release layer 120 is removed and the carrier substrate 110 is detached from the device 100 to expose the one or more electrically conductive pads 132 on the back side 100b of the device 100. The release layer 120 may be removed using any suitable techniques, such as by laser irradiation, heating or etching processes. The carrier substrate 110 is detached from the device 100 and the profile of the device 100 is reduced. Most of the mechanical support for the device elements 150 is thereby provided on the front side 100a of the device 100 instead of on the back side 100b of the device 400. Furthermore, electrical interconnection from the device elements 150 can be provided to the back side 100b of the device 100 instead of to the front side 100a of the device 100. As shown in FIG. 1J, the electrically conductive pads 132 are rerouted to the edge of the device 100 on the back side 100b of the device 100, where the rerouted electrically conductive pads 132 are electrically interconnected with the device elements 150 by the via connections 134. The electrically conductive pads 132 are rerouted without TSVs or TGVs, and without redistribution or routing layers. The electrically conductive pads 132 are rerouted using short interconnects in a thin layer of the device substrate 140.

Figure 1K:
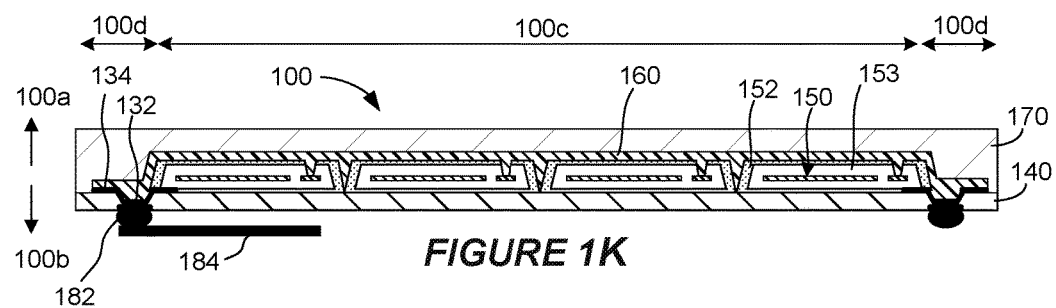

FIG. 1K shows a cross-sectional schematic of the partially fabricated device 100 up to this point or the completed device 100. Additional circuitry and electronics can be connected to the back side 100b of the device 100 and at the peripheral area 100d of the device 100. By having additional circuitry and electronics connected to the back side 100b, this can narrow or otherwise reduce the border of the device 100 while increasing the system's functionalities. In addition, this can create a thinner profile and smaller form factor compared to conventional device packaging technologies. In some implementations, a flex circuit is connected to an electrically conductive pad 132 on the back side 100b. In some implementations, a PCB or other IC is connected to an electrically conductive pad 132 on the back side 100b. Such electronics can be in electrical communication with at least some of the device elements 150 through the electrically conductive pad 132 and the one or more via connections 134. Thus, routing from the device elements 150 to PCBs, ICs or flex circuits is provided on the back side 100b of the device 100. The routing can be done without any through-glass or through-silicon vias. The routing can be done without additional routing elements or layers, including redistribution layers. As shown in FIG. 1K, a solder bump 182 is formed on an electrically conductive pad 132 to connect to a flex circuit 184 on the back side 100b.

The packaging process of FIGS. 1A-1K can allow for wafer-level chip-scale packaging of a plurality of device elements 150. The packaging process of FIGS. 1A-1K can produce a device 100 with backside interconnections. The device 100 includes a front side 100a and a back side 100b opposite the front side 100a. The device 100 includes a device substrate 140, a device element 150 over the device substrate 140 and on the front side 100a of the device 100. The device element 140 is hermetically sealed. An electrically conductive pad 132 or passive component (not shown) is provided in the device substrate 140. The electrically conductive pad 132 or the passive component is exposed on the back side 100b of the device 100, where the electrically conductive pad 132 or the passive component is electrically connected to the device element 150 by a via connection 134 in the device substrate 140. The via connection 134 and the electrically conductive pad 132 are positioned in a peripheral area 100d of the device 100, where the peripheral area 100d is outside of a device area 100c. The device element 150 is positioned on the device substrate 140 in the device area 100c of the device 100.

In some implementations, the passive component is a resistor, capacitor or inductor. In some implementations, the electrically conductive pad 132 is connected to external circuitry 184 such as a PCB or flex circuit at the back side 100b of the device 100. In some implementations, the device element 150 is an EMS device element, a MEMS device element, an OLED element, or an LED element. The device element 150 may be hermetically sealed by a sealing structure 160, such as a laminated sealing structure or a thin film encapsulation layer. A laminated sealing structure can include a bonding component covering a release hole 151, an adhesive layer on the bonding component, and a barrier layer on the adhesive layer. In some implementations, the device element 150 further includes a seal ring (not shown) on the protective layer 152, where the bonding component of the laminated sealing structure forms either a metal-to-metal bond with the seal ring or a dielectric-to-dielectric bond with the protective layer 152 without a soldering process. With a laminated sealing structure, a pressure inside the cavity 153 can be controlled to be less than a pressure outside the cavity 153. In some implementations, the device 100 further includes a molding layer 170 on the front side 100a of the device 100, where the molding layer 170 provides mechanical strength to the device 100. For example, the molding layer 170 has a thickness greater than about 10 µm, between about 10 µm and about 100 µm or greater than 100 µm, and can be substantially transparent. The device 100 can further include a carrier glass (not shown) on the molding layer 170. In some implementations, the via connection 134 extends at least partially through the device substrate 140 and has a depth between about 0.1 µm and about 2 µm.

Figure 2:
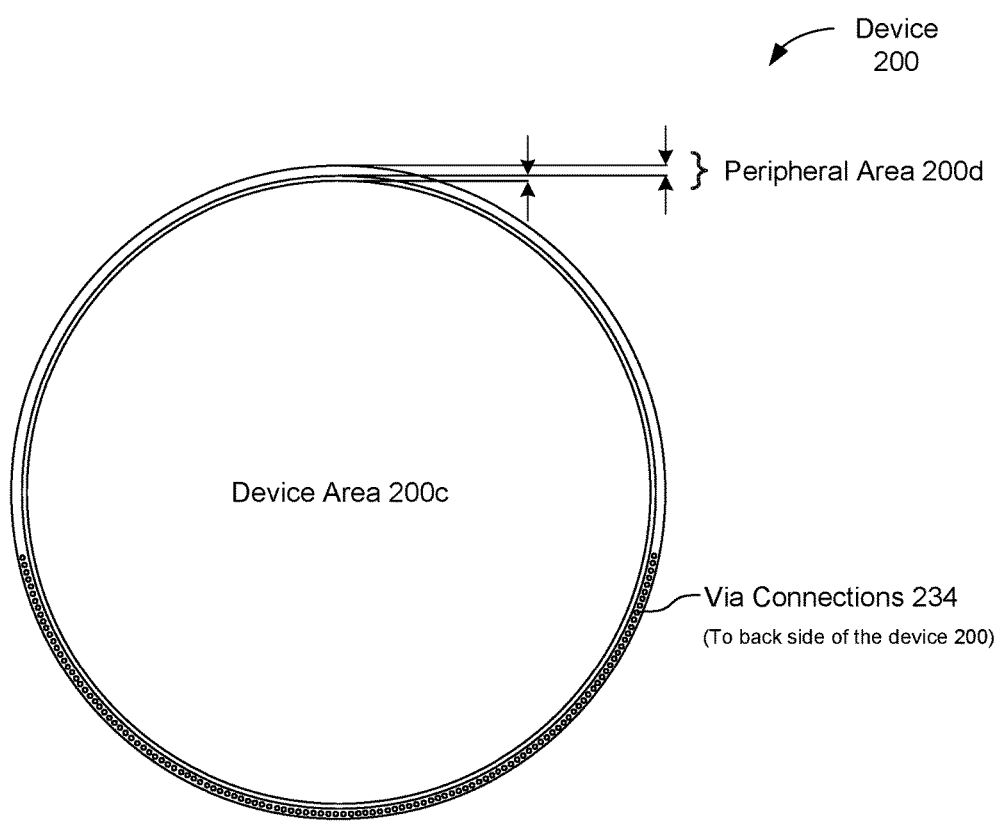
FIG. 2 shows a schematic diagram of a top view of an example device with a reduced narrow border.

FIG. 2 shows a schematic diagram of a top view (or front side) of an example device with a reduced narrow border. A device 200 can be formed after a manufacturing process is completed in FIGS. 1A-1K or in FIGS. 1A-1P. As shown in FIG. 2, the device 200 has a device area 200c that can be referred to as a "display area," "active area," or "active display area." The device 200 also has a peripheral area 200d outside of the device area 200c, where the peripheral area 200d can be referred to as a "non-display area" or "inactive area." The size of the peripheral area 200d can correspond how narrow or wide is the border or bezel of the device 200. A plurality of device elements (not shown) or an array of device elements are positioned in the device area 200c. A plurality of via connections 234 are positioned in the peripheral area 200d of the device 200. The plurality of via connections 234 in the peripheral area 200d serve as electrical interconnections from the device elements to electrically conductive pads on the back side of the device 200.

Typical packaging of devices may result in wide borders that can limit a useful device area 200c. However, the packaging solutions described in the present disclosure provides for a narrow border that can increase a useful device area 200c. By way of an example in FIG. 2, a narrow border of the peripheral area 200d may be about 1000 µm wide. The packaging solutions of the present disclosure may result in sealing area (and TFT circuitry) that covers about 200 µm or less of the 1000 µm-wide border. This leaves an additional 800 µm to accommodate via connections 234 to electrically conductive pads on a back side of the device 200. In some implementations, only the width of the electrically conductive pads occupies or defines the space of the border. For example, the width of the electrically conductive pads may be about 100 um or 500 µm. One example of a packaging solution of the present disclosure is described in further detail below in FIGS. 4A-4G.

A hermetically sealed device package provides via connections and routing to a back side of a device. While some aspects of the present disclosure provide backside interconnections in a peripheral area of a device as shown in FIGS. 1A-1K, some aspects of the present disclosure provide backside interconnections in a device area of a device. This also allows for a reduced border and greater device integration.

Figure 3A:
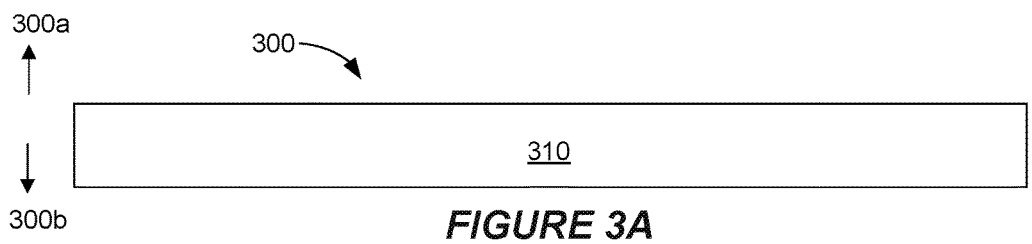
FIGS. 3A-3P shows cross-sectional schematic illustrations of various stages in a process of manufacturing an example device with backside interconnections.
Figure 3B:
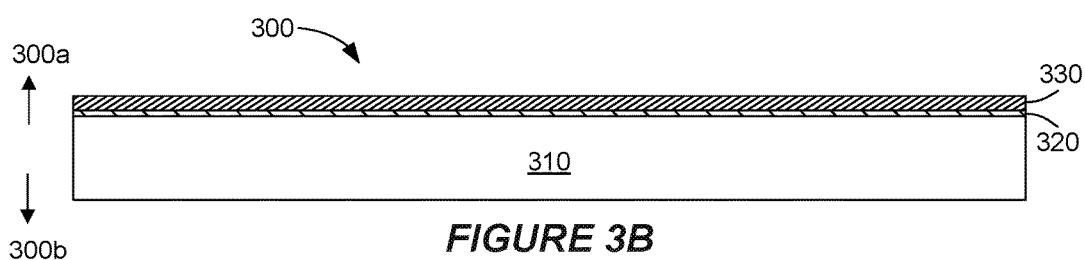
Figure 3C:
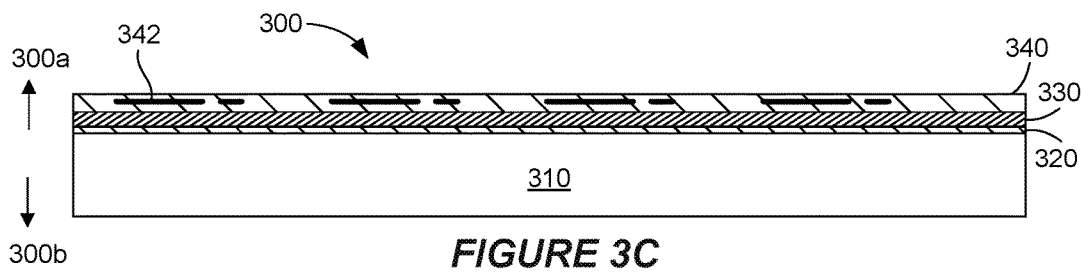
Figure 3D:
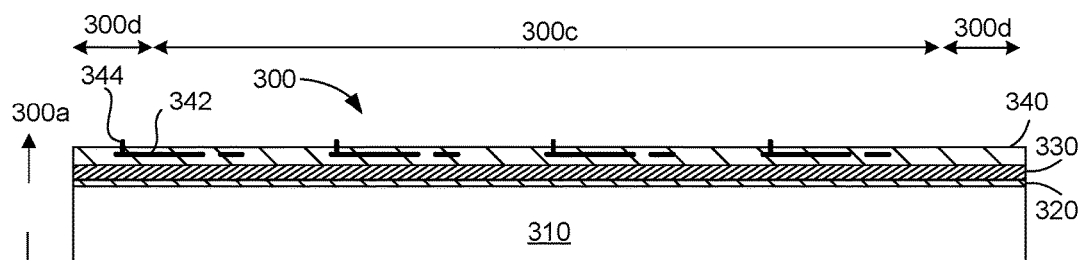
Figure 3E:
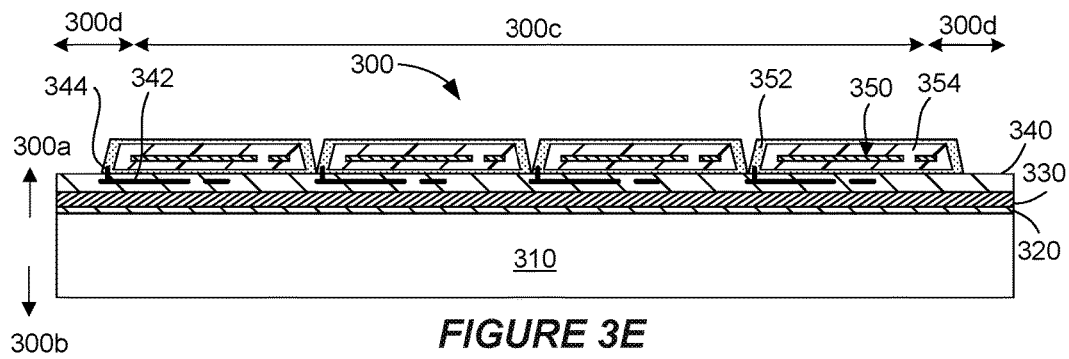
Figure 3F:
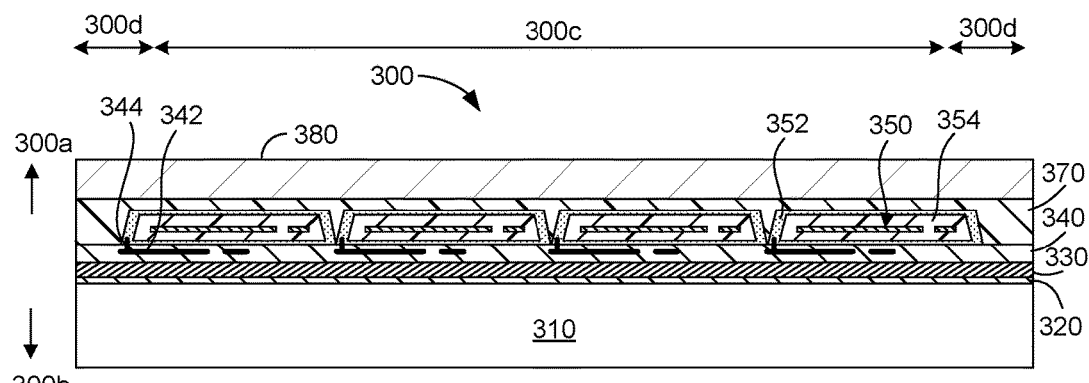
Figure 3G:
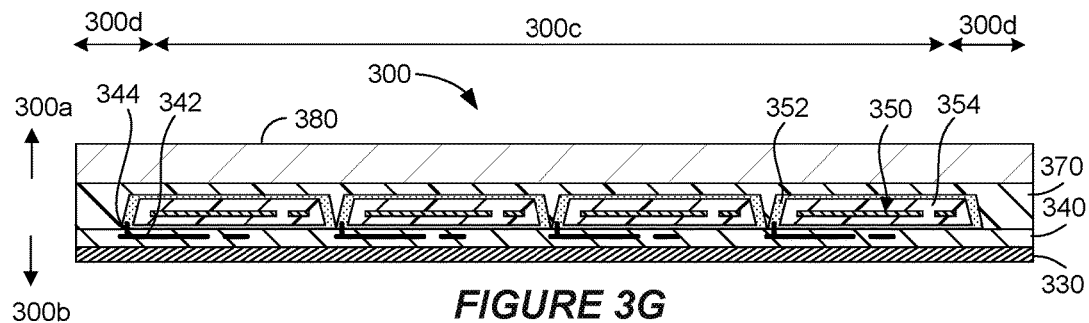
Figure 3H:
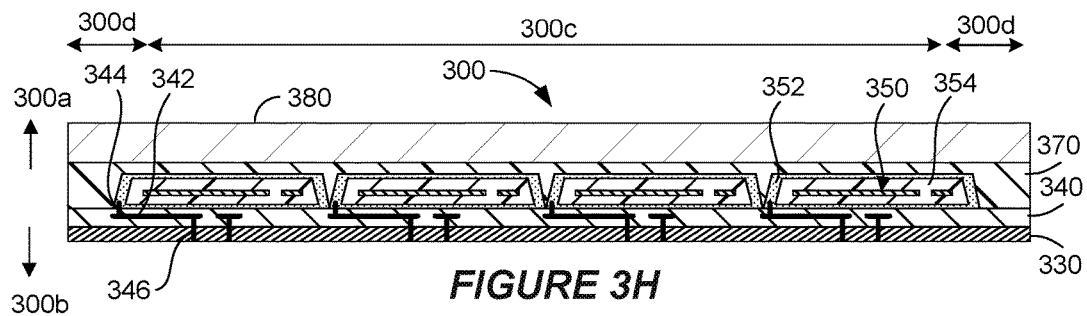
Figure 3I:
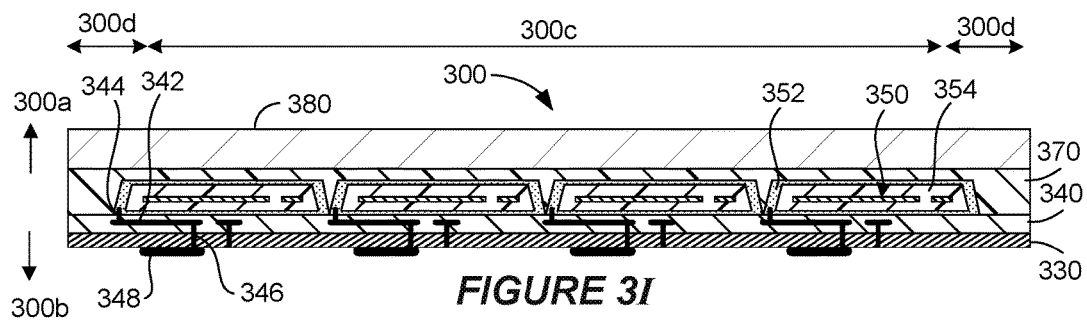
Figure 3J:
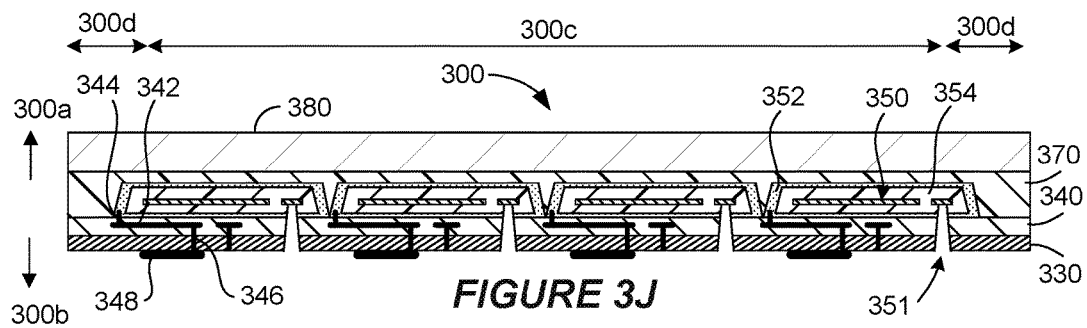
Figure 3K:
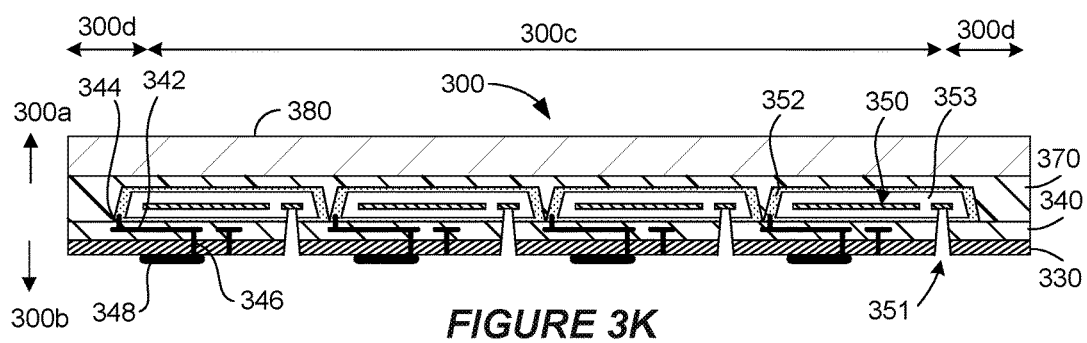
Figure 3L:
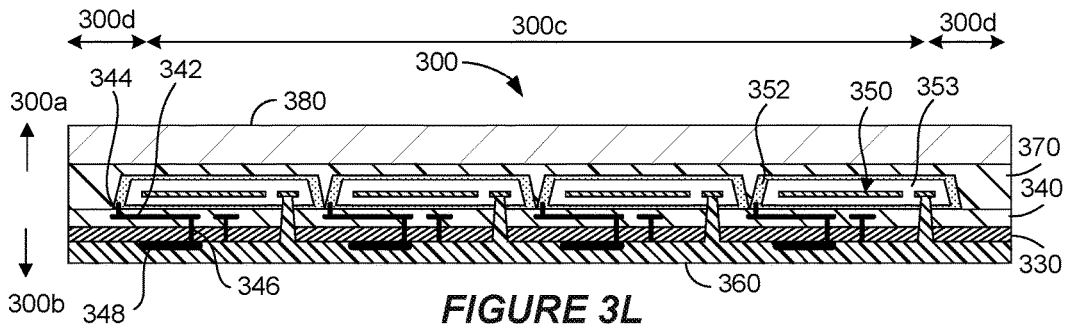
Figure 3M:
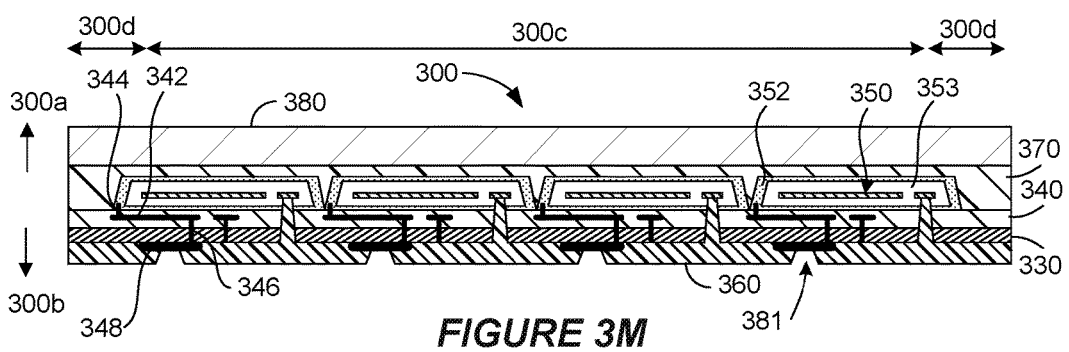
Figure 3N:
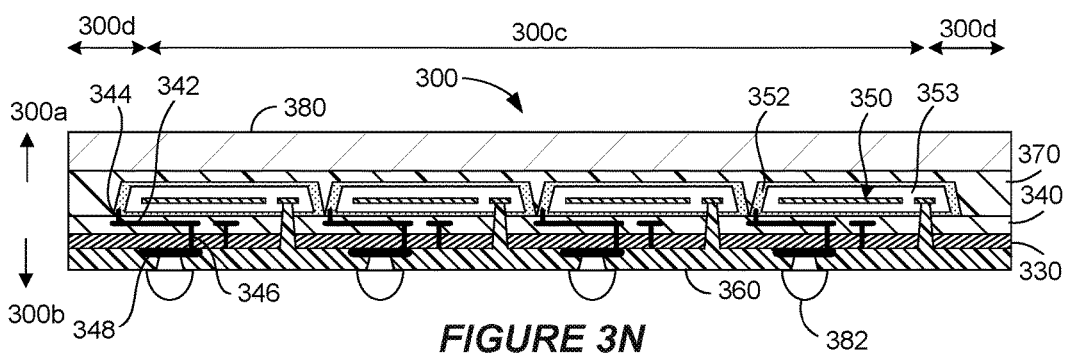
Figure 3O:
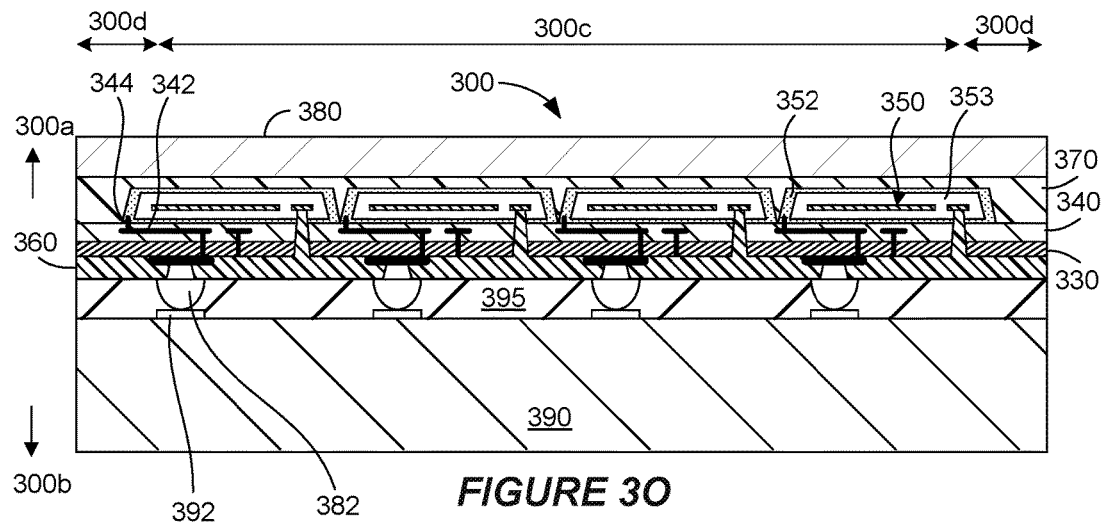
Figure 3P:
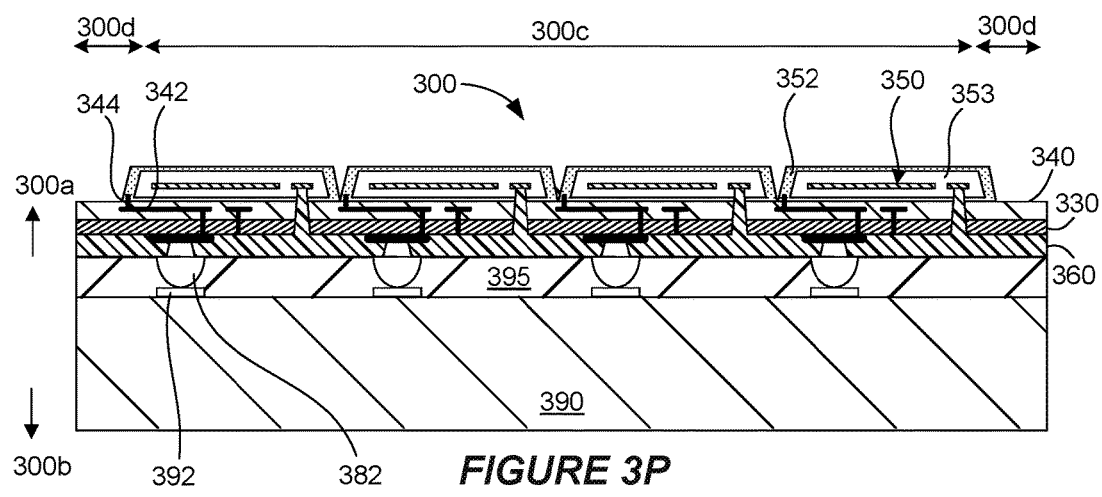

FIGS. 3A-3P shows cross-sectional schematic illustrations of various stages in a process of manufacturing an example device with backside interconnections. The process of manufacturing the device may be performed in a different order or with different, fewer or additional operations. A device 300 includes a front side 300a and a back side 300b opposite the front side 300a. The front side 300a includes device elements 350, such as OLED, LED, EMS or MEMS device elements, disposed on a device substrate 340.

FIG. 3A shows a cross-sectional schematic of the partially fabricated device 300. In FIG. 3A, a substrate 310 is provided. The substrate 310 can be made of any suitable substrate materials such as silicon, metal, ceramic, aluminum foil, alloy, plastic, glass, etc. The substrate 310 can include a non-transparent or semi-transparent material, which can be utilized in top emission display applications. The substrate 310 can include a transparent or substantially transparent material, which can be utilized in bottom emission display applications. Examples of transparent or substantially transparent materials include glass and plastic. Glass substrates (sometimes referred to as glass plates or panels) may be or include a borosilicate glass, a soda lime glass, photoglass, quartz, Pyrex or other suitable glass material. A non-glass substrate can be used, such as a polycarbonate, acrylic, polyimide, PET or PEEK substrate. In some implementations, the substrate 310 can have a thickness of a few microns to hundreds of microns. The substrate 310 can be a carrier substrate because the carrier substrate is configured to be subsequently detached or removed from the device 300.

FIG. 3B shows a cross-sectional schematic of the partially fabricated device 300 up to this point, where a release layer 320 is provided over the carrier substrate 310. In some implementations, a buffer layer 330 is optionally formed over the release layer 320. The release layer 320 can include a material that is capable of being removed, such as by a thermal, chemical or laser removal process, so that the carrier substrate 310 can be subsequently detached from the rest of the device 300. The release layer 320 may be formed on the carrier substrate 310 by a conventional deposition process, such as a CVD, PECVD, PVD, solution-based coating or evaporation process, for example. In some implementations, the release layer 320 includes a sacrificial material, such as molybdenum, amorphous silicon, polycrystalline silicon, germanium, germanium oxide, silicon oxide including silicon dioxide, polymers and combinations thereof. In some implementations, the release layer 320 has a thickness between about 0.01 µm and about 1 µm, or between about 0.1 µm and about 0.5 µm.

The buffer layer 330 can provide additional mechanical strength and rigidity to the device 300. In some implementations, the buffer layer 330 can include a dielectric material, which can be a glass material. The dielectric material may include silicon nitrides, silicon carbides, silicon oxynitrides, silicon oxides, ceramics, glass ceramics, plastics, polymers, epoxies and the like. In some implementations, the buffer layer 330 may have a thickness between about 0.5 µm and about 5 µm, or between about 1 µm and about 3 µm.

FIG. 3C shows a cross-sectional schematic of the partially fabricated device 300 up to this point, where a device substrate 340 is formed over the release layer 320. The device substrate 340 can be an active substrate or a passive substrate. As an active substrate, the device substrate 340 can include active components such as transistors, metal layers and routing. As a passive substrate, the device substrate 340 can include passive components such as resistors, capacitors and inductors. The device substrate 340 is thinner than the carrier substrate 310. In some implementations, the device substrate 340 is substantially thinner than the carrier substrate 310, such as at least 3 times, 5 times, 10 times, 20 times or 50 times thinner than the carrier substrate 310. In some implementations, the device substrate 340 has a thickness between about 0.5 µm and about 10 µm, or between about 1 µm and about 10 µm. In some implementations, the device substrate 340 includes any suitable substrate material, such as silicon, metal, ceramic, aluminum foil, alloy, glass or plastic.

Regardless of whether the device substrate 340 is an active substrate (or active layer) or passive substrate (or passive layer), the device substrate 340 includes one or more electrical components or interconnects 342. In some implementations, the one or more electrical components or interconnects 342 can include one or more TFTs, metal interconnects, routing lines, signal lines, data lines and power lines in an active layer. In some implementations, the one or more electrical components or interconnects 342 can represent routing lines, metal interconnects, metal layers or passive components such as resistors, capacitors and inductors in a passive layer. The electrical components or interconnects 342 are part of the device substrate 340. As shown in FIG. 3C, for example, some of the electrical components or interconnects 342 can be routing lines (longer line) and some of the electrical components or interconnects 342 can be power lines (shorter line).

FIG. 3D shows a cross-sectional schematic of the partially fabricated device 300 up to this point, where one or more first via connections 344 are formed at least partially through the device substrate 340 to connect to the one or more electrical components or interconnects 342 in the device substrate 340. At least a portion of the device substrate 340 is etched, drilled or otherwise removed, and electrically conductive material is deposited to form the one or more first via connections 344. The one or more first via connections 344 may only partially extend into the device substrate 340 at a shallow depth to connect to the one or more electrical components or interconnects 342. The one or more first via connections 344 do not form through-glass or through-silicon vias. The one or more first via connections 344 may include an electrically conductive material, such as a metal, and may be deposited using any suitable technique. The one or more first via connections 344 are provided on a front side 300a of the device 300. The one or more first via connections 344 will provide electrical interconnection from device elements 350 to the electrical components or interconnects 342 in a device area 300c. The device 300 can include a device area 300c and a peripheral area 300d outside of the device area 300c. For example, in a display device, the device area 300c can include an active display area and the peripheral area 300d can include a non-display area.

FIG. 3E shows a cross-sectional schematic of the partially fabricated device 300 up to this point, where one or more device elements 350 are formed over the device substrate 340 in the device area 300c. The device elements 350 are disposed in the front side 300a of the device 300. The placement or positioning of the device elements 350 can define the front side 300a as well as the device area 300c of the device 300. At least some of the device elements 350 may be electrically connected to the one or more electrical components or interconnects 342 in the device substrate 340 by the one or more first via connections 344. Accordingly, communication with other circuitry and components may be made from the device elements 350 to the device substrate 340 in the device area 300c. Furthermore, as discussed below, communication with other circuitry and components may be made from the device elements 350 in the front side 300a to the back side 300b of the device 300.

In some implementations, the device elements 350 can include any active element configured to carry out one or more operations of the device 300. In some implementations, the device elements 350 include a display element such as an OLED, LED, EMS or MEMS display element. In some implementations, the device elements 350 include an EMS or MEMS element that is not a display element. Examples of EMS or MEMS elements that are not display elements include but are not limited to touch sensors, pressure sensors, gas sensors, RF switches, accelerometers, gyroscopes, microphones and speakers. The device elements 350 are configured to be sealed in the device area 300c. In some implementations, the device elements 350 are configured to be sealed within a controlled environment and pressure. As shown in FIG. 3E, each of the device elements 350 can include a protective layer 352 and a sacrificial layer 354 within the protective layer 352. The sacrificial layer 354 can include, for example, any suitable sacrificial material. Examples of sacrificial materials include but are not limited to molybdenum, amorphous silicon, polycrystalline silicon, germanium, germanium oxide, silicon oxide including silicon dioxide, polymers and combinations thereof. The protective layer 352 can include, for example, a dielectric material to protect functional units of the device element 350. In some implementations, such functional units can include OLED or LED display layers or movable layers of an EMS or MEMS element.

FIG. 3F shows a cross-sectional schematic of the partially fabricated device 300 up to this point, where a molding layer 370 is formed over the one or more device elements 350. The molding layer 370 is optionally provided in the device 300 to provide mechanical strength and rigidity to the device 300. In some implementations, the molding layer 370 includes a polymer material. In some implementations where the device elements 350 are display elements (such as OLED, LED, EMS or MEMS display elements), the molding layer 370 is substantially transparent to allow passage of light. In some implementations, the molding layer 370 has a thickness greater than about 10 µm, between about 10 µm and about 100 µm or greater than about 100 µm.

The partially fabricated device 300 in FIG. 3F can further include a carrier layer or carrier glass 380 over the molding layer 370. The carrier layer 380 can provide further mechanical strength and rigidity to the device 300. Also, the carrier layer 380 can serve as further protection and support for the device 300.

FIG. 3G shows a cross-sectional schematic of the partially fabricated device 300 up to this point, where the release layer 320 is removed and the carrier substrate 310 is detached from the device 300. The buffer layer 330 may be exposed at the back side 300b of the device 300. The release layer 320 may be removed using any suitable techniques, such as by laser irradiation, heating or etching processes. The carrier substrate 310 is detached from the device 300 and the profile of the device 300 is reduced. Most of the mechanical support for the device elements 350 is thereby provided on the front side 300a of the device 300 instead of on the back side 300b of the device 300. Furthermore, electrical interconnection from the device elements 350 can be provided to the back side 300b of the device 300 instead of to the front side 300a of the device 300.

FIG. 3H shows a cross-sectional schematic of the partially fabricated device 300 up to this point, where one or more second via connections 346 are formed at least partially through the device substrate 340 to connect to the one or more electrical components or interconnects 342 in the device substrate 340. The one or more first via connections 344 are formed on the front side 300a of the device 300, whereas the one or more second via connections 346 are formed on the back side 300b of the device 300. In some implementations, the one or more second via connections 346 are formed through the buffer layer 330 to connect to the one or more electrical components or interconnects 342 in the device substrate 340. At least a portion of the device substrate 340, and optionally the buffer layer 330, is etched, drilled or otherwise removed. The one or more second via connections 346 may only extend partially into the device substrate 340 at a shallow depth to connect to the one or more electrical components or interconnects 342. The one or more second via connections 346 do not form through-glass or through-silicon vias. Electrically conductive material is deposited to form the one or more second via connections 346. The one or more second via connections 346 may include an electrically conductive material, such as a metal, and may be deposited using any suitable technique. The one or more second via connections 346 will provide electrical interconnection from the electrical components or interconnects 342 in the device area 300c to additional circuitry and components (such as PCBs, ICs or flex circuits).

FIG. 3I shows a cross-sectional schematic of the partially fabricated device 300 up to this point, where one or more electrically conductive pads 348 are formed on the back side 300b of the device 300 and connected to the one or more second via connections 346. In some implementations, the electrically conductive pads 348 may be disposed on the buffer layer 330 where the one or more second via connections 346 extend through the buffer layer 330. In some implementations, the electrically conductive pads 348 may be disposed on the device substrate 640 at the back side 300b of the device 300 where the device 300 lacks a buffer layer 330. The electrically conductive pads 348 include an electrically conductive material, such as a metal, and can provide electrical interconnection to other electronic components of the device 300. The electrically conductive pads 348 may be deposited using any suitable deposition technique and patterned to be in the device area 300c of the device 300.

The one or more second via connections 346 and the electrically conductive pads 348 are positioned in the back side 300b of the device 300 and in the device area 300c of the device 300. Having the electrically conductive pads 348 in the device area 300c allows for rerouting to the device area 300c. Whereas electrically conductive pads 134 are rerouted to a peripheral area 100d of a device 100 in FIGS. 1A-1K, electrically conductive pads 348 are rerouted to the device area 300c in FIG. 3I. This reroutes the electrical interconnections of the device 300 from the edge of the device 300 to an area array. This may provide for increased pad pitch, which may result in greater compatibility with PCBs that have a large pitch. A typical pad pitch that is compatible with PCBs may be between about 200 μm and about 300 μm, such as about 250 μm.

FIG. 3J shows a cross-sectional schematic of the partially fabricated device 300 up to this point, where a release hole 351 is formed to access the one or more device elements 350. In some implementations, the release hole 351 provides passage for etchants to pass through and allow the sacrificial layer 354 to be etched. The release hole 351 may be formed through a front side 300a or the back side 300b of the device 300. As shown in FIG. 3J, the release hole 351 can be formed through the back side 300b of the device 300, and particularly through the device substrate 340 and the buffer layer 330.

FIG. 3K shows a cross-sectional schematic of the partially fabricated device 300 up to this point, where the sacrificial layer 354 is removed to form a cavity 353 within each of the device elements 350. Removal of the sacrificial layer 354 results in the formation of a gap or cavity 353 so that functional units of the device element 350 may be subject to a controlled pressure or environment. In some implementations, after the sacrificial layer 354 is removed, a pressure in at least some of the device elements 350 can be controlled to a pressure of less than about 760 Torr or less than about 50 Torr. In some implementations where the functional units are movable layers of an EMS or MEMS element, the movable layers may move within the cavity 353.

FIG. 3L shows a cross-sectional schematic of the partially fabricated device 300 up to this point, where a sealing structure 360 is provided to hermetically seal the one or more device elements 350. As shown in FIG. 3L, the sealing structure 360 is formed, positioned, placed or disposed on a back side 300b of the device to enclose the device elements 350. The sealing structure 360 can plug, seal or otherwise cover the release hole 351. In some implementations, the sealing structure 360 can cover the electrically conductive pads 348 on the back side 300b of the device 300. The sealing structure 360 hermetically seals the device elements 350 from the ambient environment and protects the device elements 350 from environmental forces such as moisture ingress. In some implementations, hermetically sealing the device elements 350 includes laminating the sealing structure 360 on the back side 300b of the device 300. For example, the sealing structure 360 is laminated on the electrically conductive pads 348 and the buffer layer 330 on the back side 300b. A pressure in the cavity 353 can be less than a pressure outside of each of the device elements 350. One example of a lamination process is described in further detail below in FIGS. 4A-4G. In some implementations, hermetically sealing the device elements 350 includes depositing a thin film encapsulation layer on the back side of the device 300. For example, the sealing structure 360 is deposited as a thin film encapsulation layer on the electrically conductive pads 348 and the buffer layer 330 on the back side 300b. In some implementations, the sealing structure 360 covers the device elements 350, the one or more second via connections 346, and the one or more electrically conductive pads 348 in the device area 300c. Thus, the sealing structure 360 encloses the device elements 350 in the packaging process.

FIG. 3M shows a cross-sectional schematic of the partially fabricated device 300 up to this point, where a portion of the sealing structure 360 is removed to expose at least some of the electrically conductive pads 348. One or more openings 381 may be formed in the sealing structure 360. The one or more openings 381 may extend at least partially through the sealing structure 360 to expose at least some of the electrically conductive pads 348 on the back side 300b of the device 300. In some implementations, the one or more openings 381 may be formed by any suitable etching technique.

FIG. 3N shows a cross-sectional schematic of the partially fabricated device 300 up to this point, where one or more solder components 382 are formed in each of the openings 381. For example, the solder components 382 may include a solder bump or solder ball. The one or more solder components 382 are connected to the one or more electrically conductive pads 348 on the back side 300b of the device 300. The solder components 382 may serve as a conductive terminal to allow external circuitry to be electrically coupled to (or gain electrical access to) the device elements 350. The solder components 382 may have a certain pitch that is compatible with the pitch of the external circuitry. It will be understood that what is deposited in each of the openings 381 are not limited to solder components 382, but may include any suitable electrical interconnection structures.

FIG. 3O shows a cross-sectional schematic of the partially fabricated device 300 up to this point, where external circuitry 390 is electrically connected to the solder components 382. The external circuitry 390 may be connected to the one or more solder components 382 at one or more contact pads 392. A pad pitch of the electrically conductive pads 348 for the device 300 may be compatible with a pad pitch of the contact pads 392 for the external circuitry 390. In some implementations, the external circuitry 390 includes a PCB, IC or flex circuit. For example, the external circuitry 390 includes a PCB. Typical PCBs may be designed with a large pitch, and the pad pitch of the device 300 with backside interconnections in the device area 300c may be compatible with the large pitch of typical PCBs. In other words, by rerouting electrically conductive pads 348 to the device area 600c instead of to the peripheral area 300d, the pad pitch increases. The rerouting of the electrically conductive pads 348 occurs on the back side 300b of the device 300 without adversely affecting the front side 300a of the device 300.

A device package can be formed by electrically coupling the device 300 with the external circuitry 390 (such as a PCB). The device 300 may be directly connected by a flip chip method without the use of an intervening wire bond or tape automated bonding. In some implementations, an optional underfill layer 395 is provided between the device 300 and the external circuitry 390. The underfill layer 6395 can provide mechanical rigidity and strength between the device 300 and the external circuitry 390, can help transfer heat and sometimes act as a heat sink, and can relieve thermal mismatching between the device 300 and the external circuitry 390.

FIG. 3P shows a cross-sectional schematic of the partially fabricated device 300 up to this point or the completed device 300 attached to external circuitry 390, where the molding layer 370 and the carrier glass 380 are removed from the device 300. In implementations where device elements 350 include display elements, removal of the molding layer 370 and the carrier glass 380 may allow for passage of light in the device area 300c.

The external circuitry 390 is connected to the back side 300b of the device 300. By having additional circuitry and electronics connected to the back side 300b, this can increase the system's functionalities and narrow or otherwise reduce the border of the device 300. For example, the width of the border of the device 300 can be less than about 1 mm, less than about 500 µm or less than about 100 µm. The width of the border can be sufficiently narrow for wafer-level chip-scale packaging, where an area of the device package is not much greater than the die on which the device package is formed, or not greater than 1.5 times that of the die, such as 1.2 times greater. In addition, having additional circuitry and electronics connected to the back side 300b creates a thinner profile and smaller form factor compared to conventional device packaging technologies. External circuitry 390 can be in electrical communication with at least some of the device elements 350 through the electrically conductive pads 348 and the one or more first via connections 344 and the one or more second via connections 346. Thus, routing from the device elements 350 to PCBs, ICs or flex circuits is provided on the back side 300b of the device 300. The routing can be done without any through-glass or through-silicon vias. The routing can be done without additional routing elements or layers, including redistribution layers. The routing can be done with short interconnects in a thin layer of the device substrate 340.

The packaging process of FIGS. 3A-3P can allow for wafer-level chip-scale packaging of a plurality of device elements 350. The packaging process of FIGS. 3A-3P can produce a device 300 with backside interconnections. The device 300 includes a front side 300a and a back side 300b opposite the front side 300a. The device 300 includes a device substrate 340, a device element 350 over the device substrate 340 and on the front side of the device 300. The device element 340 is hermetically sealed. An electrically conductive pad 348 or passive component (not shown) is exposed on the back side 300b of the device 300, where the electrically conductive pad 348 or the passive component is electrically connected to the device element 350 by one or both of a first via connection 344 and a second via connection 346 in the device substrate 340. One or more electrical lines or interconnects 342 are provided in the device substrate 340 that are electrically connected to the first via connection 344 and the second via connection 346, where the one or more electrical lines or interconnects 342 include one or more routing lines. The device element 350 is positioned on the device substrate 340 in the device area 300c of the device 300, where a peripheral area 300d is outside of the device area 300c. The second via connection 346 and the electrically conductive pad 348 are positioned in the device area 300c of the device 300.

In some implementations, the passive component is a resistor, capacitor or inductor. In some implementations, the electrically conductive pad 348 may be connected to a PCB 390 at the back side 300b of the device 300. In some implementations, the device element 350 is an EMS device element, a MEMS device element, an OLED element or an LED element. The device element 350 may be hermetically sealed by a sealing structure 360, such as a laminated sealing structure or a thin film encapsulation layer. A laminated sealing structure can include a bonding component covering a release hole 351, an adhesive layer on the bonding component, and a barrier layer on the adhesive layer. In some implementations, the device element 350 further includes a seal ring (not shown) on the protective layer 352, where the bonding component of the laminated sealing structure forms either a metal-to-metal bond with the seal ring or a dielectric-to-dielectric bond with the protective layer 352 without a soldering process. With a laminated sealing structure, a pressure inside of the cavity 353 can controlled to be less than a pressure outside the cavity 353. In some implementations, the device 300 further includes a molding layer 370 on the front side 300a of the device 300, where the molding layer 370 provides mechanical strength and rigidity to the device 300. For example, the molding layer 370 has a thickness greater than about 10 µm, between about 10 µm and about 100 µm or greater than 100 µm, and can be substantially transparent. The device 300 can further include a carrier glass 380 on the molding layer 370. In some implementations, the first via connection 344 extends at least partially through the device substrate 340 and has a depth between about 0.1 µm and about 2 µm. In some implementations, the second via connection 346 extends at least partially through the device substrate 340 and has a depth between about 0.1 µm and about 2 µm.

Hermetically sealed device packages may be important for device operation and reliability. A hermetic seal of the present disclosure provides protection for the device package from the ambient environment and is applicable to wafer-level packaging. In addition, the hermetic seal provides for a small form factor, a low profile, and a reduced border while enabling backside interconnections. The hermetic seal may be provided by a direct bond or laminating process driven by a pressure differential.

FIGS. 4A-4G shows cross-sectional schematic illustrations of various stages in a process of manufacturing an example device with a laminated sealing structure. The process of manufacturing the device may be performed in a different order or with different, fewer or additional operations.

Figure 4A:
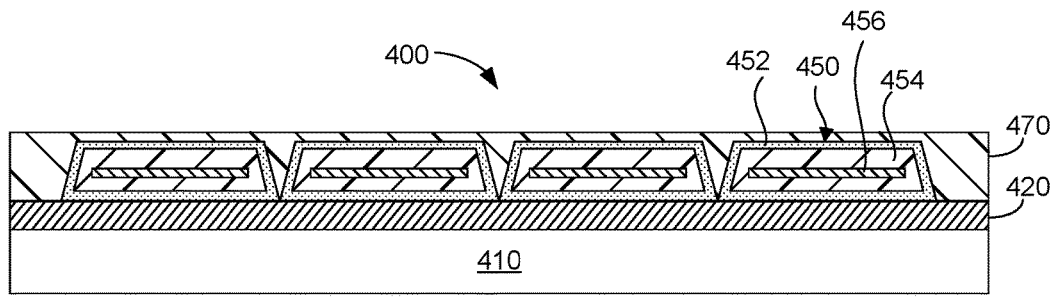
FIGS. 4A-4G shows cross-sectional schematic illustrations of various stages in a process of manufacturing an example device with a laminated sealing structure.

FIG. 4A shows a cross-sectional schematic of a partially fabricated device 400, where a plurality of device elements 450 are positioned over a carrier substrate 410 and a release layer 420. The plurality of device elements 450 may be arranged as an array of device elements 450. The array of device elements 450 may be an array of display elements through which an image may be formed. The release layer 420 may be interposed between the carrier substrate 410 and the array of device elements 450. In some implementations, a planarization layer 470 is formed over the plurality of device elements 450 to provide a flat surface upon which subsequent layers/structures may be formed. In some implementations, each of the device elements 450 can be an EMS device element, a MEMS device element, an OLED element or an LED element.

In some implementations, each of the device elements 450 may include a protective layer 452, a sacrificial layer 454 and a functional unit 456. The protective layer 452 may enclose the sacrificial layer 454 and the functional unit 456, and the sacrificial layer 454 may surround or cover the functional unit 456. The functional unit 456, for example, can include an OLED or LED display layer or a movable layer of an EMS or MEMS device element.

Figure 4B:
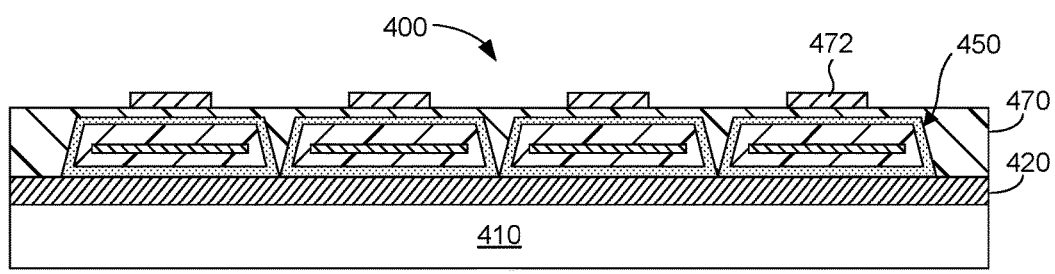

FIG. 4B shows a cross-sectional schematic of the partially fabricated device 400 up to this point, where a plurality of bonding structures 472 are optionally formed over the plurality of device elements 450. The plurality of bonding structures 472 may be deposited and patterned on the planarization layer 470 using any suitable deposition and patterning technique. In some implementations, the plurality of bonding structures 472 are made out of metal and may serve as seal rings. Such seal rings may provide a bonding interface for metal-to-metal bonding. Alternatively, the plurality of plurality of bonding structures 472 are made out of a dielectric material and may serve as a dielectric ring. Such dielectric rings may provide a bonding interface for dielectric-to-dielectric bonding.

Figure 4C:
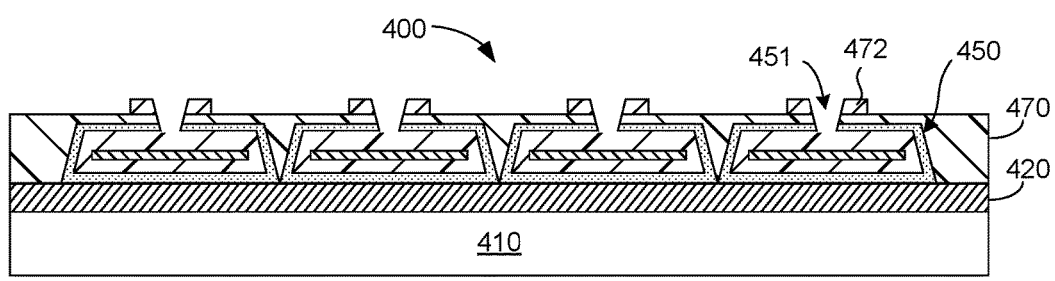

FIG. 4C shows a cross-sectional schematic of the partially fabricated device 400 up to this point, where a plurality of release holes 451 are formed extending into the plurality of device elements 450. Release holes 451 may be formed through the protective layer 452 to expose the sacrificial layer 454 in the device elements 450. In some implementations, the release holes 451 may be formed through the bonding structures 472 and the planarization layer 470. In some implementations, the release holes 451 may be aligned with a center of each of the device elements 450. In some implementations, each release hole 451 provides passage for etchants to pass through and allow the sacrificial layer 454 to be etched. In some implementations, the release holes 451 may be formed by etching, laser drilling or any other suitable technique. In some implementations, a depth of each of the release holes 451 can be between about 0.5 µm and about 20 µm, or between about 1 µm and about 10 µm.

Figure 4D:
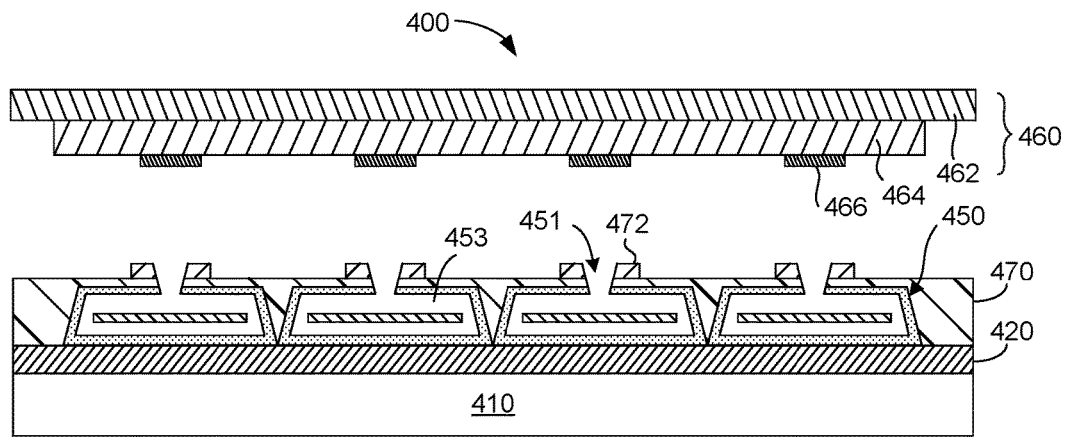

FIG. 4D shows a cross-sectional schematic of the partially fabricated device 400 up to this point, where the sacrificial layer 454 is removed to form a cavity 453 within each of the device elements 450. Removal of the sacrificial layer 454 results in the formation of a gap or cavity 453 so that functional units 456 of the device element 450 may be subject to a controlled pressure or environment. In some implementations where the functional units 456 are movable layers of an EMS or MEMS element, the movable layers may move within the cavity 453.

After the sacrificial layer 454 is removed, a sealing structure 460 is provided over the plurality of device elements 450. The sealing structure 460 seals the device elements 450 from exposure to the ambient environment. As shown in FIG. 4D, the sealing structure 460 includes a carrier layer 462, an adhesive layer 464, and a plurality of bonding components 466. The sealing structure 460 in FIG. 4D also may be referred to as "sealing tape." The adhesive layer 464 can be formed, placed, positioned or disposed on the carrier layer 462. Each of the bonding components 466 can be formed, placed, positioned or disposed on the adhesive layer 464. The carrier layer 462 can include a substrate material, such as silicon, metal, ceramic, aluminum foil, alloy, glass or plastic. Some examples of substrate materials for the carrier layer 462 include polyethylene terephthalate (PET) and polyethylene naphthalate (PEN). The carrier layer 462 may be detachable from the adhesive layer 464. In some implementations, the carrier layer 462 has a thickness between about 10 µm and about 500 µm, or between about 100 µm and about 300 µm. The adhesive layer 464 can include an adhesive material, such as an epoxy-based adhesive. In some implementations, the adhesive layer 464 has a thickness between about 0.1 µm and about 100 µm, or between about 5 µm and about 50 µm. The bonding components 466 can each include a low-temperature solder material for metal-to-metal bonding or a dielectric material for dielectric-to-dielectric bonding. Some examples of low-temperature solder material include indium-based, bismuth-based, tin-based, gold-based and copper-based metals and metal alloys. An example of a dielectric material includes silicon dioxide ($SiO_2$). The low-temperature solder material of the bonding component 466 can be bonded to the bonding structure 472 to form a metal-to-metal bond, or the dielectric material of the bonding component 466 can be bonded to the bonding structure 472, the planarization layer 470 or the protective layer 452 to form a dielectric-to-dielectric bond.

Prior to contacting the sealing structure 460 with the device 400 including the planarization layer 470 and the plurality of device elements 450, a pressure inside the cavity 453 of each of the device elements 450 can be controlled. In some implementations, the cavity 453 of each of the device elements 450 can be vacuum pumped to a few Torr or less, or pumped to less than about 50 Torr, or pumped to less than about 760 Torr. Controlling the pressure inside the cavity 453 can protect the functional units 456 of the device elements 450 and improve device operation.

Figure 4E:
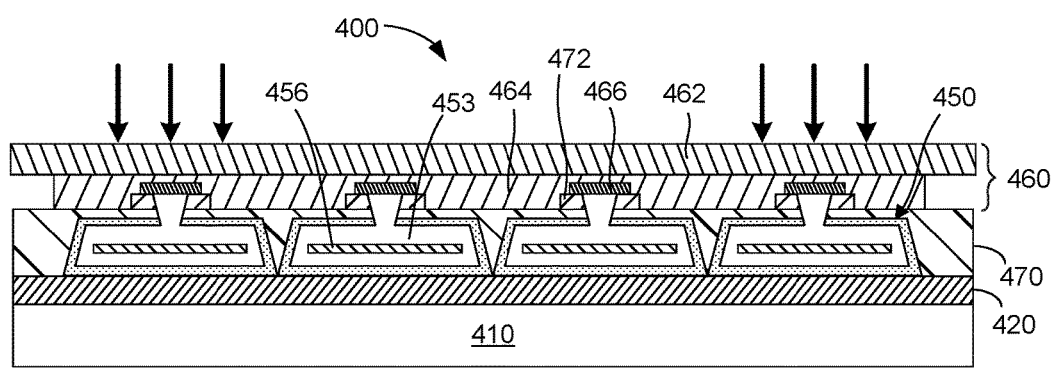

FIG. 4E shows a cross-sectional schematic of the partially fabricated device 400 up to this point, where the sealing structure 460 contacts the device 400 to hermetically seal the device elements 450. In some implementations with bonding structures 472, the sealing structure 460 can be oriented, positioned and aligned so that the bonding components 466 contact the bonding structures 472. In some implementations without bonding structures 472, the sealing structure 460 can be oriented, positioned and aligned so that the bonding components 466 contact the planarization layer 470 or the protective layer 452. The bonding components 466 plug, seal or otherwise cover the release holes 451. The release holes 451 are plugged, sealed or otherwise covered without using any soldering process or additional capping layers. When the sealing structure 460 is in contact with the device 400, a pressure outside the cavity 453 can be brought to a substantially higher pressure than inside the cavity 453. For example, the pressure outside the cavity 453 can be increased to greater than 100 Torr or atmospheric pressure. A pressure difference between outside and inside the cavity 453 can cause a force to be applied on the sealing structure 460, where the pressure outside the cavity 453 is greater than the pressure inside the cavity 453. This laminates the sealing structure 460 over the device elements 450 and the release hole 451. The bonding components 466 can be pressed against the bonding structures 472 to form metal-to-metal bonds or dielectric-to-dielectric bonds, or the bonding components 466 can be pressed against the planarization layer 470 or the protective layer 452 to form dielectric-to-dielectric bonds. In some implementations, the pressure inside the cavity 453 can be pumped to a few Torr or less, and the pressure outside the cavity 453 can remain at atmospheric pressure or greater, and the substantial amount of pressure difference causes the sealing structure 460 to be bonded to the device 400. This type of bonding can be referred to as "vacuum lamination."

In addition, the bonding components 466 can be exposed to an elevated temperature. In some implementations, the elevated temperature is greater than room temperature but less than about 350° C. or less than about 300° C. The combination of the high pressure difference and the elevated temperature creates a direct bond between the bonding component 466 and the bonding structure 472 for a metal-to-metal bond or dielectric-to-dielectric bond, or between the bonding component 466 and the planarization layer 470 or the protective layer 452 for a dielectric-to-dielectric bond.

The metal-to-metal bond or the dielectric-to-dielectric bond forms a hermetic seal in the device 400. The metal-to-metal bond can include a metallic bond formed without reflowing the solder material. The dielectric-to-dielectric bond can include a covalent bond, which can form between non-metal atoms. In some implementations, for example, a hydrogen atom can serve as an intermediate to connect an oxygen atom in the bonding component 466 and an oxygen atom in the protective layer 452. An oxide-to-oxide bond forms a very strong covalent bond for a hermetic seal.

Figure 4F:
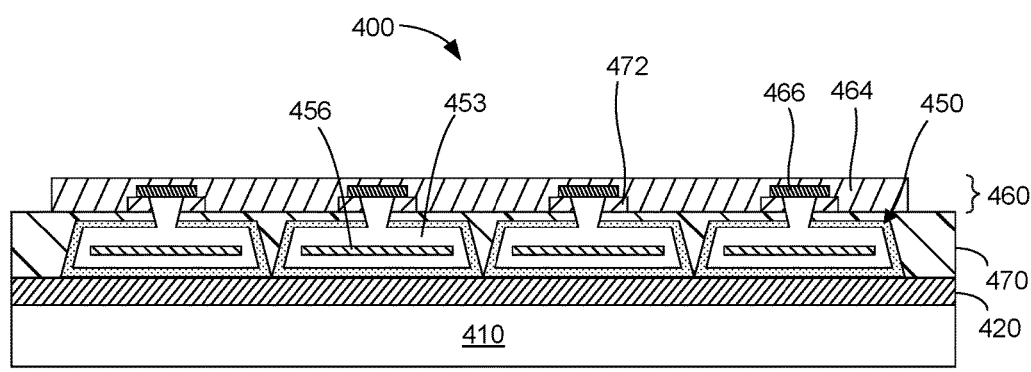

FIG. 4F shows a cross-sectional schematic of the partially fabricated device 400 up to this point, where the carrier layer 462 is removed after the sealing structure 460 is bonded or laminated to the device 400. In some implementations, the carrier layer 462 can be debonded, peeled or otherwise detached from the adhesive layer 464. The adhesive layer 464 remains conformally coated over the device elements 450. The adhesive layer 464 and the bonding components 466 provide a hermetic seal for the device elements 450.

Figure 4G:
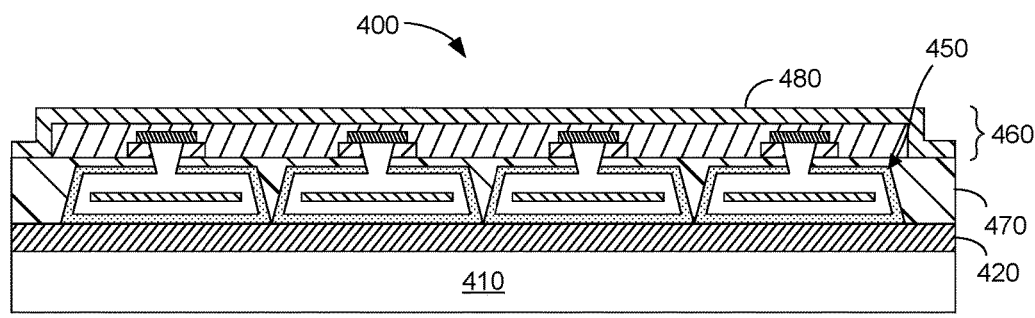

FIG. 4G shows a cross-sectional schematic of the partially fabricated device 400 up to this point or the completed device 400, where a barrier layer 480 is optionally formed, positioned, placed or disposed on the adhesive layer 464. In some implementations, the barrier layer 480 may be pre-built with the sealing structure 460. Where the adhesive layer 464 may be insufficient for protecting against diffusion of contaminants, moisture ingress or other environmental forces, the barrier layer 480 provides additional protection for the device 400. In some implementations, the barrier layer 480 includes any suitable insulating material, such as aluminum oxide (AlOx), aluminum nitride (AlN) and silicon nitride (SiN).

The release layer 420 is capable of being removed and the carrier substrate 410 is capable of being detached from the device 400. Removal of the release layer 420 and the carrier substrate 410 enables the device 400 to form backside interconnections. That way, processing may continue on a back side of the device 400, as described earlier with respect to FIGS. 1A-1K, 2 and 3A-3P. In addition, removal of the release layer 420 and the carrier substrate 400 reduces form factor, provides a thinner profile and minimizes circuitry and other hardware on the edges of the device 400. The total occupied space on the edges of the device 400 can be determined by the width of electrically conductive pads, instead of by circuitry or other hardware on a front side of the device 400.

Figure 5:
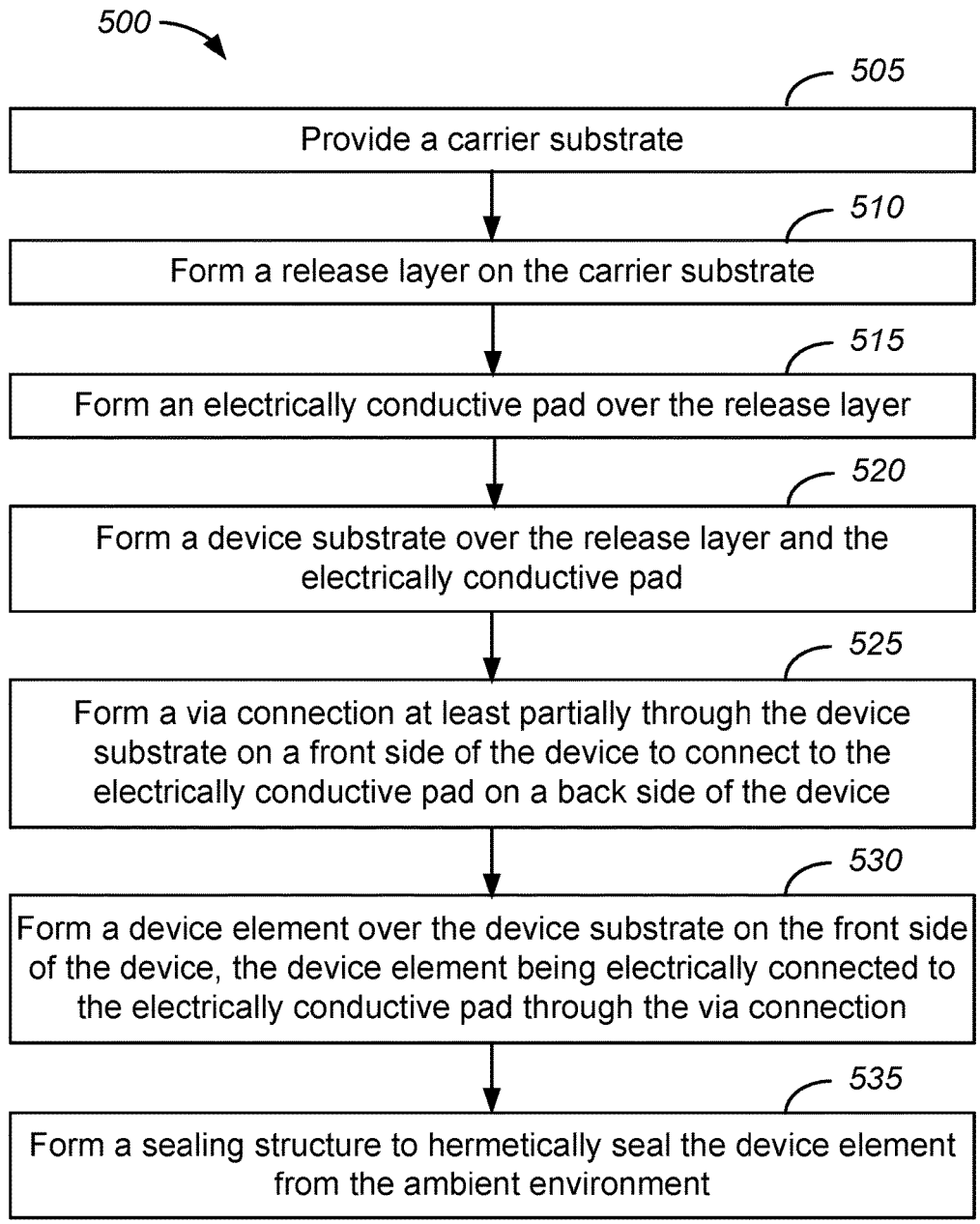
FIG. 5 shows a flow diagram illustrating an example process for manufacturing a device.

FIG. 5 shows a flow diagram illustrating an example process for manufacturing a device according to some implementations. A process 500 may be performed in a different order or with different, fewer or additional operations.

At block 505 of the process 500, a carrier substrate is provided. The carrier substrate can be made of any suitable substrate materials, such as silicon, metal ceramic, alloy, aluminum foil, glass or plastic. In some implementations, the carrier substrate has a thickness greater than 10 μm, between 10 μm and 100 μm or greater than 100 μm. The carrier substrate can be configured to be removed from a device.

At block 510 of the process 500, a release layer is formed on the carrier substrate. The release layer may include a material that is capable of being removed, such as by a thermal, chemical or laser removal process. In some implementations, the release layer includes a sacrificial material. In some implementations, the release layer has a thickness between about 0.05 μm and about 1 μm, or between about 0.1 μm and about 0.5 μm.

At block 515 of the process 500, an electrically conductive pad is formed over the release layer. In some implementations, the process 500 further includes forming a buffer layer between the electrically conductive pad and the release layer. A device can include a device area and a peripheral area outside of the device area. The peripheral area can surround the device area. In some implementations, the electrically conductive pad can be patterned to be in the peripheral area of the device.

At block 520 of the process 500, a device substrate is formed over the release layer and the electrically conductive pad. In some implementations, the device substrate can be formed as an active substrate with one or both of a TFT and routing lines. In some implementations, the device substrate can be formed as a passive substrate with passive components such as resistors, capacitors and inductors. The device substrate can include any suitable substrate material, such as silicon, metal, ceramic, alloy, aluminum foil, glass or plastic. In some implementations, the device substrate has a thickness between about 0.5 μm and about 20 μm, or between about 1 μm and about 10 μm. The carrier substrate can be substantially thicker than the device substrate.

At block 525 of the process 500, a via connection is formed at least partially through the device substrate on a front side of the device to connect to the electrically conductive pad on a back side of the device. The front side can represent a side of the device on which a device element is formed, and the back side is a side opposite the front side. At least a portion of the device substrate can be etched, drilled or otherwise removed in a peripheral area of the device. Electrically conductive material can be deposited in the removed portion of the device substrate to form the via connection. The via connection provides electrical interconnection from a device element of the device to the electrically conductive pad.

At block 530 of the process 500, a device element is formed over the device substrate on the front side of the device, the device element being electrically connected to the electrically conductive pad through the via connection. The placement or positioning of the device element can define the front side of the device. The device element is formed in the device area of the device. Communication with external circuitry may be made from the device element from the front side to the back side, and communication with external circuitry may be made from the device area to the peripheral area. In some implementations, the device element includes an EMS device element, a MEMS device element, an OLED element or an LED element. The device element may be sealed within a controlled environment. In some implementations, the device element includes a protective layer, a sacrificial layer and a functional unit. The protective layer may enclose the sacrificial layer and the functional unit, and the sacrificial layer may surround or cover the functional unit. The functional unit can include, for example, an OLED or LED display layer or a movable layer of an EMS or MEMS device element.

At block 535 of the process 500, a sealing structure is formed to hermetically seal the device element. In some implementations, the process 500 further includes forming a release hole into the device element and removing the sacrificial layer to form a cavity within the device element. When the cavity is formed within the device element, a pressure within the cavity may be controlled (such as vacuum pumped) to provide a controlled environment. For example, a pressure in the cavity can be reduced to less than about 760 Torr, less than about 50 Torr or less than about 5 Torr. The sealing structure can contact the device to hermetically seal the device element. In some implementations, the sealing structure can plug, seal or otherwise cover the release hole. The sealing structure may protect the device element from moisture ingress and other environmental forces. In some implementations, forming the sealing structure includes laminating the sealing structure over the device element and the release hole, where the sealing structure includes a bonding component covering the release hole and an adhesive layer on the bonding component. A pressure inside the cavity can be less than a pressure outside of the cavity. For example, laminating the sealing structure can include reducing a pressure inside a cavity of the device element to less than 50 Torr, contacting the sealing structure with the device element and increasing a pressure outside the cavity to greater than 50 Torr. In some implementations, forming the sealing structure includes depositing a thin film encapsulation layer over the device element and the release hole. The sealing structure encloses the device element in a device packaging process. In some implementations, the process 500 further includes forming a molding layer over the device element on the front side of the device. The molding layer can provide mechanical rigidity and strength to the device. The molding layer can include a polymer material. The molding layer can have a thickness greater than about 10 µm, between about 10 µm and about 100 µm, or greater than about 100 µm.

In some implementations of the process 500, the release layer is removed to detach the carrier substrate from the device and expose the electrically conductive pad at the back side of the device. The release layer may be removed by laser irradiation, heating, etching or other suitable removal process. The removal of the release layer and the detachment of the carrier substrate lowers the profile of the device, and electrical interconnection can be made to external circuitry on the back side of the device. In some implementations, the process 500 further includes connecting external circuitry to the electrically conductive pad at the back side of the device. For example, the external circuitry can include a flex circuit or PCB.

Figure 6:
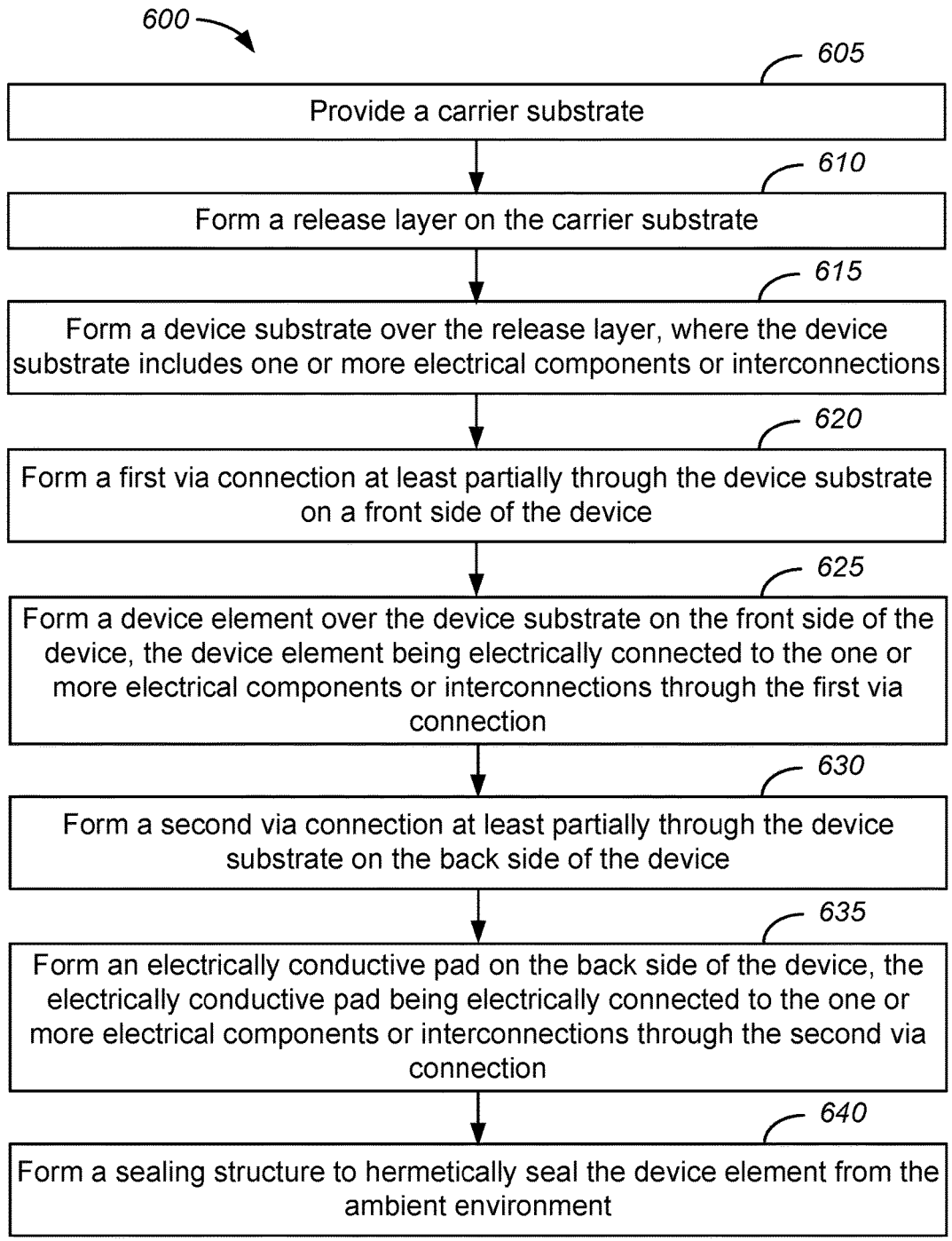
FIG. 6 shows a flow diagram illustrating an example process for manufacturing a device.

FIG. 6 shows a flow diagram illustrating an example process for manufacturing a device according to some other implementations. A process 600 may be performed in a different order or with different, fewer or additional operations.

At block 605 of the process 600, a carrier substrate is provided. The carrier substrate can be made of any suitable substrate materials, such as silicon, metal, ceramic, alloy, aluminum foil, glass or plastic. In some implementations, the carrier substrate has a thickness greater than 10 µm, between 10 µm and 100 µm or greater than 100 µm. The carrier substrate can be configured to be removed from a device.

At block 610 of the process 600, a release layer is formed on the carrier substrate. The release layer may include a material that is capable of being removed, such as by a thermal, chemical or laser removal process. In some implementations, the release layer includes a sacrificial material. In some implementations, the release layer has a thickness between about 0.05 µm and about 1 µm, or between about 0.1 µm and about 0.5 µm.

At block 615 of the process 600, a device substrate is formed over the release layer, where the device substrate includes one or both of a TFT and routing lines. In some implementations, the process 600 further includes forming a buffer layer between the release layer and the device substrate. A device can include a device area and a peripheral area outside of the device area. The peripheral area can surround the device area. In some implementations, the device substrate can be formed as an active substrate, where the active substrate has one or more electrical components or interconnects, such as routing lines and TFTs. Additional metal interconnects, signal lines, data lines, power lines may be provided in the device substrate. In some implementations, the device substrate can be formed as a passive substrate with passive components such as resistors, capacitors and inductors. The device substrate can include any suitable substrate material, such as silicon, metal, ceramic, alloy, aluminum foil, glass or plastic. In some implementations, the device substrate has a thickness between about 0.5 µm and about 20 µm, or between about 1 µm and about 10 µm. The carrier substrate can be substantially thicker than the device substrate.

At block 620 of the process 600, a first via connection is formed at least partially through the device substrate on a front side of the device. At least a portion of the device substrate is etched, drilled or otherwise removed, and electrically conductive material is deposited in the removed portion to form the first via connection. The first via connection may be electrically connected to the one or more electrical components or interconnects of the device substrate. The first via connection provides electrical interconnection from a device element to the device substrate.

At block 625 of the process 600, a device element is formed over the device substrate on the front side of the device, the device element being electrically connected to the one or more electrical components or interconnects through the first via connection. The placement or positioning of the device element can define the front side of the device. The device element is formed in the device area of the device. Communication with external circuitry may be made from the device element from the front side to the back side. In some implementations, the device element includes an EMS device element, a MEMS device element, an OLED element or a LED element. The device element may be sealed within a controlled environment. In some implementations, the device element includes a protective layer, a sacrificial layer and a functional unit. The protective layer may enclose the sacrificial layer and the functional unit, and the sacrificial layer may surround or cover the functional unit. The functional unit can include, for example, an OLED or LED display layer or a movable layer of an EMS or MEMS device element. In some implementations, the process 600 further includes forming a molding layer over the device element on the front side of the device. The molding layer can provide mechanical rigidity and strength to the device. The molding layer can include a polymer material. The molding layer can have a thickness greater than about 10 µm, between about 10 µm and about 100 µm, or greater than about 100 µm. In some implementations, the process 600 further includes providing a carrier glass over the molding layer.

In some implementations of the process 600, the release layer is removed to detach the carrier substrate from the device and expose the device substrate at the back side of the device. In some implementations, the buffer layer is exposed at the back side of the device. The release layer may be removed by laser irradiation, heating, etching or other suitable removal process. The removal of the release layer and the detachment of the carrier substrate lowers the profile of the device, and electrical interconnection can be made to external circuitry on the back side of the device.

At block 630 of the process 600, a second via connection is formed at least partially through the device substrate on the back side of the device. At least a portion of the device substrate is etched, drilled or otherwise removed, and electrically conductive material is deposited in the removed portion to form the second via connection. The second via connection may be electrically connected to the one or more electrical components or interconnects of the device substrate. The second via connection provides electrical interconnection from the one or more electrical components or interconnects to a back side of the device. The second via connection is provided in the device area of the device. The first via connection is formed on the front side of the device, whereas the second via connection is formed on the back side of the device. In some implementations, the second via connection is formed through the buffer layer to connect to the one or more electrical components or interconnects. The first and second via connections route electrical interconnection from the device element to external circuitry (such as a flex circuit or PCB).

At block 635 of the process 600, an electrically conductive pad is formed on the back side of the device, the electrically conductive pad being electrically connected to the one or both of a TFT and routing lines through the second via connection. The electrically conductive pad may be formed on the buffer layer or on the device substrate at the back side of the device. The electrically conductive pad may be formed in the device area of the device. Having the electrically conductive pad in the device area allows for rerouting to the device area. In other words, this reroutes electrical interconnections from the edge of the device to an area array. This can provide for increased pad pitch, which may result in greater compatibility with PCBs that typically have a large pitch.

At block 640 of the process 600, a sealing structure is formed to hermetically seal the device element. The sealing structure may be formed on the front side or the back side of the device. In some implementations, the process 600 further includes forming a release hole into the device element and removing the sacrificial layer to form a cavity within the device element. When the cavity is formed within the device element, a pressure within the cavity may be controlled (such as vacuum pumped) to provide a controlled environment. For example, a pressure in the cavity can be reduced to less than about 760 Torr, less than about 50 Torr or less than about 5 Torr. The sealing structure can contact the device to hermetically seal the device element. In some implementations, the sealing structure can plug, seal or otherwise cover the release hole. This can be done without a soldering process or additional capping layers. The sealing structure may protect the device element from moisture ingress and other environmental forces. In some implementations, forming the sealing structure includes laminating the sealing structure over the device element and the release hole, where the sealing structure includes a bonding component covering the release hole and an adhesive layer on the bonding component. A pressure inside the cavity can be less than a pressure outside of the cavity. For example, laminating the sealing structure can include reducing a pressure inside a cavity of the device element to less than 50 Torr, contacting the sealing structure with the device element and increasing a pressure outside the cavity to greater than 50 Torr. In some implementations, forming the sealing structure includes depositing a thin film encapsulation layer over the device element and the release hole. The sealing structure encloses the device element in a device packaging process. In some implementations, the process 600 further includes connecting external circuitry to the electrically conductive pad at the back side of the device. For example, the external circuitry can include a flex circuit or PCB.

Figure 7A:
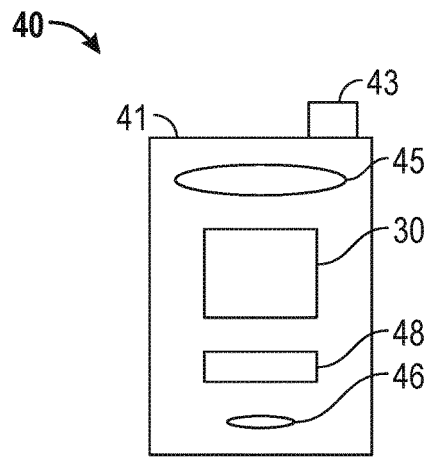
FIGS. 7A and 7B are system block diagrams illustrating a display device that includes a plurality of display elements.
Figure 7B:
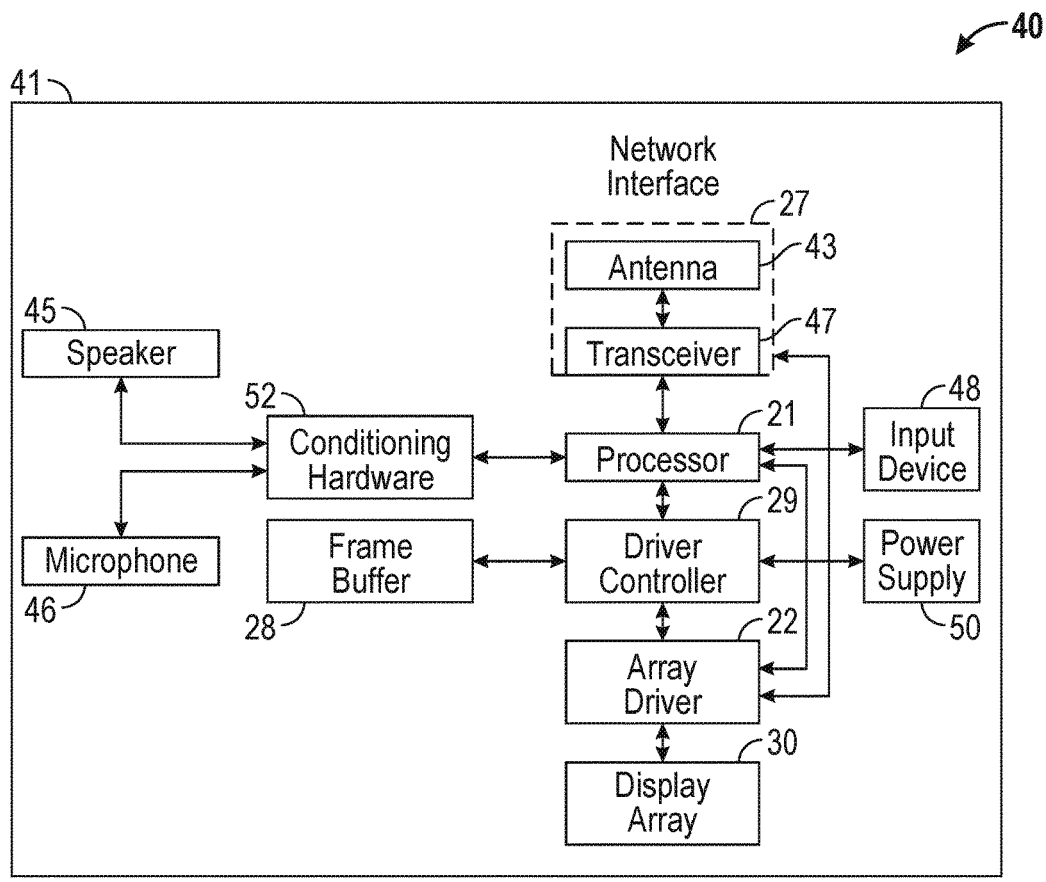

FIGS. 7A and 7B are system block diagrams illustrating a display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display. The display 30 also can be configured to include a flat-panel display, such as plasma, EL, OLED, STN LCD, or TFT LCD, or a non-flat-panel display, such as a CRT or other tube device.

The components of the display device 40 are schematically illustrated in FIG. 7A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 7A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower," "top" and "bottom" "above" and below," "over" and "under" and the like are sometimes used for ease of describing the figures, and indicate relative positions corresponding to the orientation of the figure on a properly oriented page, and may not reflect the proper orientation of a display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device having a front side and a back side opposite the front side, the device comprising:
   a device substrate;
   a device element over the device substrate and on the front side of the device, wherein the device element is hermetically sealed;
   an electrically conductive pad exposed on the back side of the device;
   one or more via connections extending at least partially through the device substrate, wherein at least one of the via connections is electrically connected to the electrically conductive pad, and wherein the one or more via connections provide electrical interconnection from the device element to the electrically conductive pad; and
   a laminated sealing structure to hermetically seal the device element and comprising a protective layer with a release hole extending through the protective layer to a cavity inside the device element, wherein the laminated sealing structure includes: a bonding component covering the release hole and an adhesive layer on the bonding component.

2. The device of claim 1, wherein the one or more via connections are electrically connected to one or both of a routing line and a thin film transistor (TFT) in the device substrate.

3. The device of claim 1, wherein the device has a device area and a peripheral area outside of the device area, the device element and the electrically conductive pad being in the device area.

4. The device of claim 1, wherein the device has a device area and a peripheral area outside of the device area, the device element being in the device area and the electrically conductive pad and the one or more via connections being in the peripheral area.

5. The device of claim 1, wherein the device substrate has a thickness between about 0.5 µm and about 10 µm.

6. The device of claim 1, wherein the electrically conductive pad is connected to a flex circuit or a printed circuit board (PCB) on the back side of the device.

7. The device of claim 1, wherein the device has a pad pitch compatible with a pad pitch of the PCB.

8. The device of claim 1, wherein the laminated sealing structure includes:
a barrier layer on the adhesive layer.

9. The device of claim 8, wherein the device element further includes a seal ring on the protective layer, and wherein the bonding component forms either a metal-to-metal bond with the seal ring or a dielectric-to-dielectric bond with the protective layer.

10. The device of claim 8, wherein a pressure outside the cavity is greater than a pressure inside the cavity.

11. The device of claim 1, wherein the laminated sealing structure includes: a thin film encapsulation layer to hermetically seal the device element from the ambient environment.

12. The device of claim 1, further comprising:
a passive component on the back side of the device, wherein the passive component includes a resistor, capacitor or an inductor.

13. The device of claim 1, wherein the laminated sealing structure includes:
a molding layer over the device element and on the front side of the device; and
a carrier glass over the molding layer.

14. The device of claim 1, wherein each of the one or more via connections has a depth between about 0.1 µm and about 2 µm.

15. The device of claim 1, wherein the device element is an electromechanical systems (EMS) element, a microelectromechanical systems (MEMS) element, a light-emitting diode (LED) element or an organic light-emitting diode (OLED) element.

16. A device comprising:
a substrate;
a plurality of device elements positioned over the substrate, each of the device elements including:
a functional unit; and
a protective layer over the functional unit, the protective layer having a release hole extending through the protective layer to access a cavity defined inside the device element; and
a laminated sealing structure bonded over the plurality of device elements to hermetically seal the device, wherein the laminated sealing structure includes:
an adhesive layer; and
one or more bonding components on a side of the adhesive layer facing the plurality of device elements, each of the bonding components sealing each of the release holes of the protective layer.

17. The device of claim 16, wherein the laminated sealing structure further includes:
a barrier layer on a side of the adhesive layer opposite the side facing the plurality of device elements.

18. The device of claim 16, wherein the protective layer includes a bonding structure, each of the bonding components forming a metal-to-metal bond with the bonding structure or a dielectric-to-dielectric bond with the bonding structure, wherein the metal-to-metal bond includes a metallic bond with the bonding structure and the dielectric-to-dielectric bond includes a covalent bond with the bonding structure.

19. The device of claim 16, wherein a pressure inside the cavity is controlled to be less than a pressure outside the cavity.

20. The device of claim 16, wherein each of the device elements is an EMS element, a MEMS element, an OLED element or an LED element.

21. The device of claim 16 further comprising;
an electrically conductive pad exposed on a back side of the substrate opposite the plurality of devices; and
one or more via connections extending at least partially through the substrate, wherein at least one of the via connections is electrically connected to the electrically conductive pad, and wherein the one or more via connections provide electrical interconnection from a device element of the plurality of device elements to the electrically conductive pad.

22. The device of claim 16, wherein the one or more via connections are electrically connected to one or both of a routing layer and a TFT layer in the device substrate.

23. The device of claim 16, wherein the device has a device area and a peripheral area outside of the device area, the device element and the electrically conductive pad being in the device area.

24. The device of claim 16, wherein the device has a device area and a peripheral area outside of the device area, the device element being in the device area and the electrically conductive pad and the one or more via connections being in the peripheral area.

25. The device of claim 16, wherein the device substrate has a thickness between about 0.5 µm and about 10 µm.

26. The device of claim 16, wherein the electrically conductive pad is connected to a flex circuit or a PCB on the back side of the device.

27. The device of claim 16, wherein the device has a pad pitch compatible with a pad pitch of the PCB.

28. The device of claim 16, wherein the laminated sealing structure includes a thin film encapsulation layer to hermetically seal the device element from the ambient environment.

29. The device of claim 16, further comprising:
a passive component on the back side of the device, wherein the passive component includes a resistor, capacitor or an inductor.

30. The device of claim 16, wherein the laminated sealing structure includes:
a molding layer over the device element and on the front side of the device; and
a carrier glass over the molding layer.

31. The device of claim 16, wherein each of the one or more via connections has a depth between about 0.1 µm and about 2 µm.

* * * * *